(12) United States Patent
Kuo et al.

(10) Patent No.: US 12,368,229 B2
(45) Date of Patent: Jul. 22, 2025

(54) ANTENNA ARRAY WITH REPLACEABLE ANTENNA CELL

(71) Applicant: YTTEK TECHNOLOGY CORP., Hsinchu County (TW)

(72) Inventors: Fang-Yao Kuo, Hsinchu County (TW); Wen-Chiang Chen, Hsinchu (TW); Hao-Ju Huang, Taoyuan (TW)

(73) Assignee: YTTEK TECHNOLOGY CORP., Hsinchu Country (TW)

( * ) Notice: Subject to any disclaimer, the term of this patent is extended or adjusted under 35 U.S.C. 154(b) by 200 days.

(21) Appl. No.: 18/459,449

(22) Filed: Sep. 1, 2023

(65) Prior Publication Data
US 2024/0079760 A1 Mar. 7, 2024

Related U.S. Application Data

(60) Provisional application No. 63/374,508, filed on Sep. 2, 2022.

(51) Int. Cl.
*H01Q 1/22* (2006.01)
*H01L 23/00* (2006.01)
(Continued)

(52) U.S. Cl.
CPC ........... *H01Q 1/2283* (2013.01); *H01L 24/16* (2013.01); *H01Q 1/48* (2013.01); *H01Q 9/0457* (2013.01);
(Continued)

(58) Field of Classification Search
CPC ...... H01Q 1/2283; H01Q 1/48; H01Q 9/0457; H01Q 21/24; H01Q 1/523; H01Q 9/045;
(Continued)

(56) References Cited

U.S. PATENT DOCUMENTS 9,099,777 B1 * 8/2015 Manry, Jr. ............... H01Q 1/38
10,056,922 B1 * 8/2018 Tsvelykh .................. H01P 1/20
(Continued)

FOREIGN PATENT DOCUMENTS

| CN | 114497974 A | 5/2022 |
|---|---|---|
| CN | 115732906 A | 3/2023 |

OTHER PUBLICATIONS

Wu, Fan et al., "A wideband dual-polarized magneto-electric dipole antenna for millimeter wave applications", Microw Opt Technol Lett. Jan. 1-6, 2020, Oct. 31, 2020.
(Continued)

*Primary Examiner* — Seung H Lee
(74) *Attorney, Agent, or Firm* — WPAT, P.C.; Anthony King

(57) ABSTRACT

An antenna structure includes a first substrate and a second substrate. The first substrate includes: a semiconductor chip configured to transmit or receive a first radio-frequency (RF) signal; a first ground layer configured to provide ground to the semiconductor chip; and a signal layer arranged on a side of the first substrate opposite to the semiconductor chip and configured to transmit the first RF signal. The second substrate has an antenna array formed of antenna cells, each of the antenna cells including: a first antenna layer configured to radiate second RF signals based on the first RF signal; a second ground layer configured to provide ground to the first antenna layer. The antenna device further includes a plurality of connectors electrically coupling the semiconductor chip to the antenna array.

20 Claims, 30 Drawing Sheets

(51) Int. Cl.
  *H01Q 1/48* (2006.01)
  *H01Q 9/04* (2006.01)
  *H01Q 21/24* (2006.01)

(52) U.S. Cl.
  CPC ... *H01Q 21/24* (2013.01); *H01L 2224/16225* (2013.01)

(58) Field of Classification Search
  CPC .................. H01Q 21/065; H01L 24/16; H01L 2224/16225
  See application file for complete search history.

(56) References Cited

U.S. PATENT DOCUMENTS

| | | |
|---|---|---|
| 2016/0049723 A1 | 2/2016 | Baks et al. |
| 2018/0076526 A1 | 3/2018 | García et al. |
| 2019/0027804 A1* | 1/2019 | Kim ........................ H01L 24/20 |
| 2019/0051989 A1* | 2/2019 | Kim ...................... H01Q 19/062 |
| 2020/0161744 A1 | 5/2020 | Baks et al. |

OTHER PUBLICATIONS

Mirhamed Mirmozafari et al., Dual-Polarization Antennas With High Isolation and Polarization Purity, IEEE Antennas Propagation Magazine, Feb. 2019.

Intellectual Property Office, the Ministry of Economic Affairs, R.O.C., "First Office Action", issued on Aug. 19, 2024.

English Summary Translation of "First Office Action" dated Aug. 19, 2024, issued by Intellectual Property Office, the Ministry of Economic Affairs, R.O.C.

English Abstract Translation of CN 115732906A and CN11497974A.

* cited by examiner

ANTENNA ARRAY WITH REPLACEABLE ANTENNA CELL

PRIORITY CLAIM AND CROSS-REFERENCE

This application claims priority to U.S. provisional application Ser. No. 63/374,508 filed Sep. 2, 2022, the disclosure of which is hereby incorporated by reference in its entirety.

TECHNICAL FIELD

The present disclosure relates to an antenna device, and more particularly, to an antenna array with replaceable antenna cells.

BACKGROUND

Wireless transmission technologies has progressed rapidly and are widely used in modern fixed and portable transmission equipment. As the transmission bandwidth and frequency of the wireless transmission are increased for pursuing improved performance, the device size is required to be reduced, which would inevitably incur higher manufacturing and maintenance cost. Among the various techniques, the antenna array or array antenna is one of the promising players that have been researched to provide high-speed and long-range wireless transmission devices. However, as the antenna array has been developed for many years, there are still many challenges that need to be overcome, e.g., the cost of a large-sized antenna array is still relatively high in its assembling and trouble-shooting processes. Therefore, there is a need to develop new architectures to fulfill the requirements of modern antenna arrays.

SUMMARY

According to embodiments of the present disclosure, an antenna structure includes a first substrate and a second substrate. The first substrate includes: a semiconductor chip configured to transmit or receive a first radio-frequency (RF) signal; a first ground layer configured to provide ground to the semiconductor chip; and a signal layer arranged on a side of the first substrate opposite to the semiconductor chip and configured to transmit the first RF signal. The second substrate has an antenna array formed of antenna cells, each of the antenna cells including: a first antenna layer configured to radiate second RF signals based on the first RF signal; a second ground layer configured to provide ground to the first antenna layer. The antenna device further includes a plurality of connectors electrically coupling the semiconductor chip to the antenna array.

According to embodiments of the present disclosure, an antenna structure includes a first substrate and a second substrate. The first substrate includes: a semiconductor chip arranged on a first side of the first substrate and configured to receive or transmit a first radio-frequency (RF) signal; a plurality of first insulating layers; and a plurality of first conductive layers alternately arranged with the first insulating layers, the first conductive layers including a signal layer arranged on a second side of the first substrate opposite to the first side and configured to receive the first RF signal. The second substrate is electrically coupled to the first substrate and has an array of antenna cells, wherein each of the antenna cells includes: a plurality of second insulating layers; and a plurality of second conductive layers alternately arranged with the second insulating layers. The second conductive layers includes a first antenna layer configured to radiate second RF signals based on the first RF signal.

Through the proposed antenna array structure, the antenna cells and the RF circuit are provided in separate substrates and bonded to form the integrated antenna device. The complexity of manufacturing the large-sized antenna can be decreased, and the cost in manufacturing and maintaining the antenna array can be lowered. The antenna reliability can also be improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
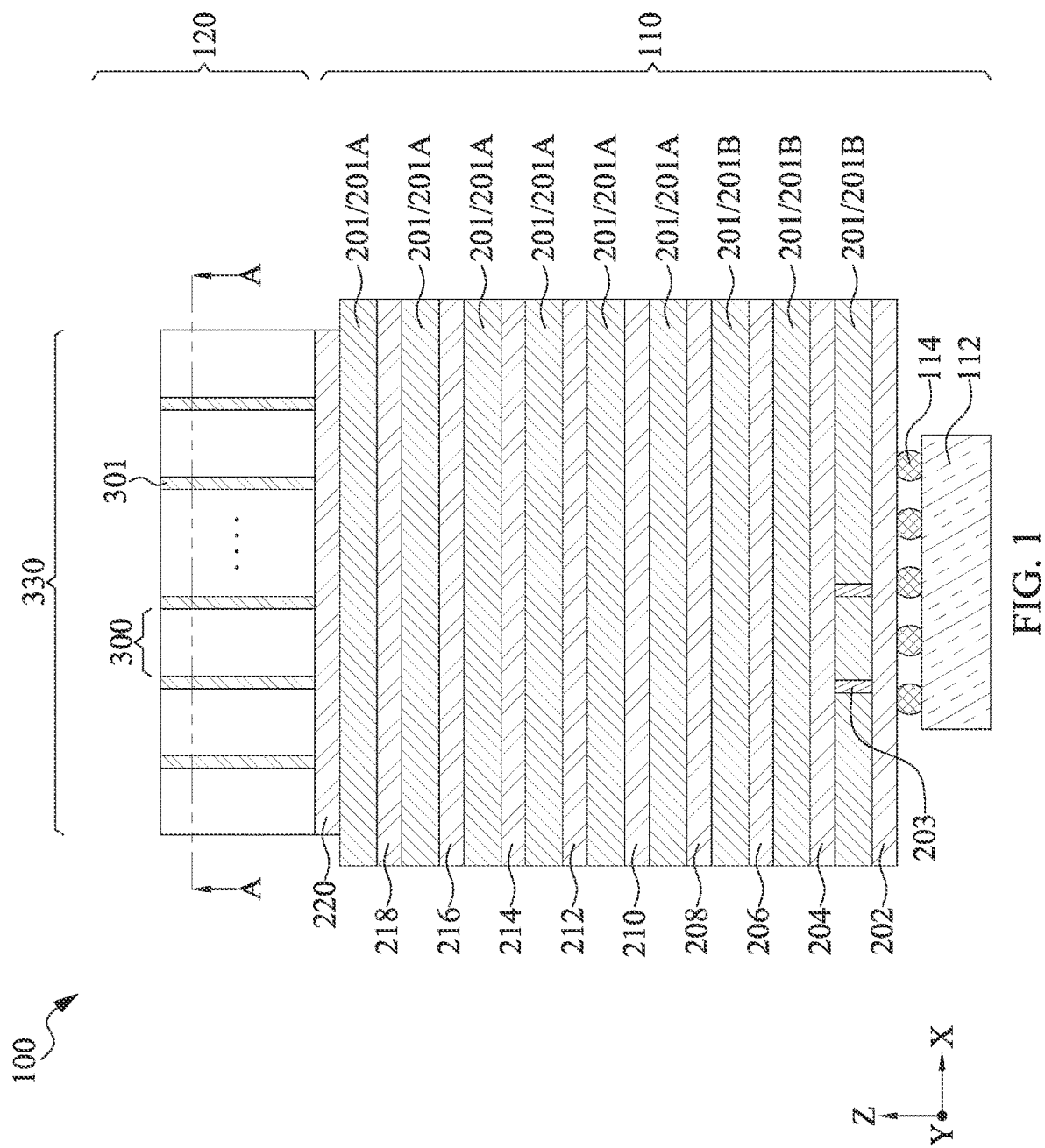
FIG. 1 is a cross-sectional view of an antenna device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

Embodiments of the present disclosure discusses an antenna array structure for portable and mobile applications. People have witnessed the rapid growth of the mobile communication market and the huge need in incorporating the communication capability into the existing devices in the fields of agriculture, healthcare, education, etc., so as to connect different entities of the world more closely in efficient way. The transmission bandwidth and time delay of the wireless communication should be improved further, and the antenna design should also fulfill the requirement of enhanced antenna performance with acceptable antenna size. To address the ever-growing need of the antenna, the antenna array structure is proposed to provide different types of transmission signals with respective signal properties. For example, the antenna array may be configured to transmit and receive a beam of transmission signals with constructive interference of various antenna signals provided by individual antenna cells of the antenna array. However, as the number of antenna cells is increased, the manufacturing cost and complexity would grow rapidly since the antenna performance is sensitive to the uniformity of the antenna substrate, or the substrate planarity. The repairing and maintenance of the large-area antenna array would be challenging if one or more of the antenna cells fail since that would need a huge amount of work. Moreover, the existing antenna framework makes it difficult to scale the antenna array between different sizes for different antenna applications. In addition, the existing single-substrate antenna design requires a high-performance substrate material for the entire circuitry of the antenna device, thereby inevitably increasing cost greatly. Further, the cross-polarization interference in the existing antenna framework still needs to be reduced.

To address the abovementioned issues, the present disclosure discusses a dual-substrate antenna array, in which the antenna device is partitioned into a circuit substrate and an antenna substrate. The circuit substrate and the antenna substrate are formed of different substrate materials, such that a higher requirement of the substrate planarity of the antenna substrate can be achieved with reasonable cost. Further, each of the antenna cells constituting the antenna array can be the replaced and repaired on demand individually, which significantly reduce the effort and cost of maintaining the antenna array on the antenna substrate. As a result, the manufacturing and maintenance cost and complexity of the antenna array can be greatly decreased.

FIG. 1 is a cross-sectional view of an antenna device 100, in accordance with some embodiments of the present disclosure. According to some embodiments, the antenna device 100 includes an antenna array 330 formed of a plurality of antenna cells 300 from a top-view perspective. The antenna device 100 may be used in various applications, e.g., the mobile communications for the fifth-generation (5G) communication system or beyond, satellite communications, virtual-reality (VR) systems, augmented-reality (AR) systems, etc. The antenna device 100 may be operated in a predetermined frequency, e.g., a frequency band of 18 GHz, 28 GHz, or other suitable frequency bands. According to some embodiments, the antenna device 100 is configured as a wireless transmitter for generating an RF signal, and radiating the RF signal to an ambient environment through an antenna patch of the antenna device 100. Such RF signal may be processed or transmitted by the antenna device 100 before being radiated outwardly. According to some other embodiments, the antenna device 100 is configured as a wireless receiver for receiving an RF signal from an ambient environment through an antenna patch of the antenna device 100. Such RF signal may be processed or transmitted after being received from the antenna patch of the antenna device 100. The order of RF signal transmission and processing for the wireless receiver may be reversed to that for the wireless transmitter.

According to some embodiments, the antenna device 100 includes a circuit substrate 110 and an antenna substrate 120. The circuit substrate 110 is electrically bonded to the antenna substrate 120 and configured to generate radio-frequency (RF) signals and transmit the same to the antenna substrate 120. According to some embodiments, the circuit substrate 110 is a printed circuit board (PCB) with a laminated structure. As depicted in FIG. 1, the circuit substrate 110 includes a plurality of insulating layers 201 and a plurality of conductive layers 202, 204, 206, 208, 210, 212, 214, 216, 218 and 220. The insulating layers 201 are alternately arranged with the conductive layers 202, 204, 206, 208, 210, 212, 214, 216, 218 and 220. According to some embodiments, each of the insulating layers 201 includes an electrically insulating material or a dielectric material, e.g., FR-4, polytetrafluoroethylene (PTFE or Teflon), a polymer material, or the like. According to some embodiments, the FR-4 material is formed of glass fabric and epoxy resin, where the symbols 'FR' indicates the material is flame retardant and the number '4' indicates woven glass reinforced epoxy resin. According to some embodiments, each of the conductive layers 202, 204, 206, 208, 210, 212, 214, 216, 218 and 220 are formed of a conductive material, e.g., copper, aluminum, tungsten, silver and gold. The conductive layers 202, 204, 206, 208, 210, 212, 214, 216, 218 and 220 may be in a form of foil laminated with the insulating layers 201 to construct the circuit substrate 110.

According to some embodiments, some layers of the insulating layers 201, e.g., insulating layers 201A, are proximal to the conductive layers 210, 212, 214, 216, 218 and 220 which carry low-frequency or direct-current (DC) signals, and the insulating layers 201A are formed of a low-frequency dielectric material, e.g., an FR-4 material, which is adequate for low-frequency signals and can reduce the material cost. Such low-frequency insulating layers 201A can provide transmission of low-frequency or direct-current (DC) signals, e.g., control signals for the signal with a frequency no greater than about 10 MHz. Further, according to some embodiments, some other layers of the insulating layers 201, e.g., insulating layers 201B, are proximal to conductive layers 202, 204, 206 and 208 which carry high-frequency RF signals, and the insulating layers 201B are formed of a high-frequency dielectric material, e.g. a hydrocarbon-based or PTFE-based material, which can provide low-loss transmission property for the RF signals of frequency up to about 40 GHz.

According to some embodiments, circuit patterns, such as conductive traces and ground patches are patterned on the conductive layers 202, 204, 206, 208, 210, 212, 214, 216, 218 and 220. The patterning operation may include photolithography and etching operations. Further, one or more conductive vias, e.g., an exemplary conductive via 203 as illustrated in a bottommost insulating layer 201, are formed in the insulating layers 201. The conductive vias 203 may extend through the thickness of the insulating layers 201 to electrically connect the overlying conductive layers 202 through 218 to the underlying conductive layers 204 through 220. According to some embodiments, the conductive vias 203 include a conductive material, e.g., copper, tungsten, aluminum, silver, gold or the like.

As an exemplary manufacturing process, the conductive via 203 is formed by etching a through via that extends through the insulating layer 201 to reach and expose a circuit pattern in the underlying conductive layers 202 through 218. A conductive material is deposited in the through via to fill the through via, thereby forming the conductive via 203 and electrically connecting to the underlying circuit pattern.

Referring to FIG. 1, the circuit substrate 110 includes a semiconductor chip 112. The semiconductor chip 112 may be bonded or attached to a first side (lower side) of the circuit substrate 110 or the conductive layer 202. According to some embodiments, the semiconductor chip 112 is formed as a semiconductor die and configured to generate, transmit, receive or process one or more communication signals, e.g., a pair of RF signals RF1A and RF2A. The RF signals RF1A and RF2A may include modulated data signals independent of each other. The semiconductor chip 112 may be formed including one or more of a signal generator, a baseband modulator/demodulator, an analog signal converter, an intermediate frequency (IF) signal generator, an RF up-converter/down-converter, a mixer, a passband filter, a memory device, a network interface, and the like.

According to some embodiments, the circuit substrate 110 further includes a plurality of connectors 114 electrically connecting the semiconductor chip 112 to the conductive layer 202. The connectors 114 may include a solder material formed of lead-based materials, such as Sn, Pb, Ni, Au, Ag, Cu, Bi, combinations thereof, or mixtures of other electrically conductive materials. According to some other embodiments, the connectors 114 includes a lead-free material. The connectors 114 may include conductive bumps configured as contact bumps, such as controlled collapse chip connection (C4) bumps, ball grid array (BGA) bumps, or microbumps.

Each of the conductive layers 202 through 220 may be configured to serve different functions and may include different circuit patterns. According to some embodiments, the conductive layer 202 is configured as an interface layer configured to electrically connecting the semiconductor chip 112 to the overlying conductive layers 204 through 220. According to some embodiments, the circuit substrate 110 further includes one or more surface-mount devices (not separately shown) arranged on the first side of the conductive layer 202 adjacent to the semiconductor chip 112. The surface-mount devices may include resistors, capacitors, inductors, diodes, or the like. The surface-mount devices are configured to improve the electrical properties of the semiconductor chip 112, e.g., suppressing noise or stabilizing the voltage level or the current level in the semiconductor chip 112.

According to some embodiments, the conductive layers 204, 208, 212 and 218 include one or more ground patches configured as ground layers for providing a reference grounding level to the circuits of the circuit substrate 110, e.g., the semiconductor chip 112, the conductive layers 202, 206, 210, 214, 216 and 220 and the antenna substrate 120. The ground layers 204, 208, 212, and 218 may also provide shielding between the different conductive layers of the circuit substrate 110. The ground layers 204, 208, 212, and 218 each may have different patch patterns from a top-view perspective.

According to some embodiments, the conductive layer 206 is configured as an RF signal layer used for route the RF signals RF1A, RF2A provided by the semiconductor chip 112 to the overlying conductive layers. The conductive layer 206 may be electrically connected to the RF output port (or contact pad) of the semiconductor chip 112 through a circuit pattern formed on the conductive layer 206. According to some embodiments, the conductive layer 206 is arranged between two ground layers 204, 208.

According to some embodiments, the conductive layer 210 is configured as a control signal layer used for transmitting one or more control signals to the antenna substrate 120. The control signal may be provided in a baseband form by the semiconductor chip 112 and is not modulated to another carrier frequency. According to some embodiments, the control signal is provided as a digital signal and configured to transmit digitalized control information generated by the semiconductor chip 112. The control signal or the digitized control information may include parameters for each antenna cells 300 of the antenna array 330, e.g., the amplitude and phase of each antenna cell 300, in which the parameters are provided to the individual antenna cells for achieving a desirable antenna performance, e.g., a shape of the antenna beam, the antenna gain, and the like.

According to some embodiments, the conductive layers 214 and 216 are configured as power layers used for transmitting power to the antenna substrate 120. The power may be direct-current (DC) power. The power may be provided from another substrate (not separately shown) and electrically connected to the conductive layers 214 and 216 through the conductive layer 202 and a routing circuit between the conductive layers 202 and 214, 216. The conductive layers 214 and 216 may be patterned to route the power port (or power contact pad) of the conductive layer 202 or the semiconductor chip 112 to the antenna substrate 120 through the overlying conductive layer 220.

According to some embodiments, the conductive layer 220 is configured as a bonding layer electrically bonded to the antenna substrate 120 and used to output the RF signals RF1A, RF2A generated by the semiconductor chip 112. The conductive layer 220 may be configured as a topmost layer of the circuit substrate 110 to be bonded to the antenna substrate 120. According to some embodiments, the conductive layer 220 is also referred to another RF signal layer, and the circuit substrate 110 further includes conductive pads or contact pads (not separately shown) formed on the circuit pattern of the conductive layer 220, such that the conductive pads are electrically coupled to the antenna substrate 120, in which the RF signals RF1A, RF2A are transmitted through the conductive layer 220 and the conductive pads.

In the depicted example as shown in FIG. 1, each of the conductive layers 202 through 220 is illustrated as a rectangular box including only one material, such as the conductive material. However, the box merely represents the conductive portion, i.e., the circuit pattern, of the conductive layers 202 through 220, and the circuit pattern in each of the conductive layers 202 through 220 is electrically insulated from the circuit patterns in the other conductive layers 202 through 220. The insulation may be achieved by the insulating material of the insulating layers 201. As a result, the circuit pattern in each conductive layer 202 through 220 is electrically encapsulated or wrapped around by the insulating layers 201 and electrically connected to other circuit patterns in the overlying or underlying conductive layers 202 through 220 by help of the conductive vias 203.

The layer number and configurations for each of the conductive layers 202 through 220 or the insulating layers 201 discussed above with reference to FIG. 1 are provided for illustrative purposes only. Other numbers of the layers of the circuit substrate 110 and other layer configurations are also within the contemplated scope of the present disclosure. For example, the locations and numbers of the ground layers 204, 208, 212 and 218 or and power layers 214, 216 may be increased or decreased, and the ground patches or the power patches in these ground layers or power layers may be modified according to different requirements. Further, the circuit substrate 110 shown in FIG. 1 is provided as an exemplary transmitter. However, the circuit substrate 110 can also be configured as a receiver, wherein the RF signals RF1A, RF2A are received from the antenna substrate 120 and transmitted to the semiconductor chip 112 via a signal path. The signal path starts from connectors (not shown in FIG. 1, but labelled as connectors 421 in FIG. 5D), through the conductive layers 220, 218, 216, 214, 212, 210, 208, 206 and 204, and reaches the semiconductor chip 112 on the conductive layer 202. The order of RF signal transmission and processing for the receiver may be reversed to that for the transmitter.

Figure 2A:
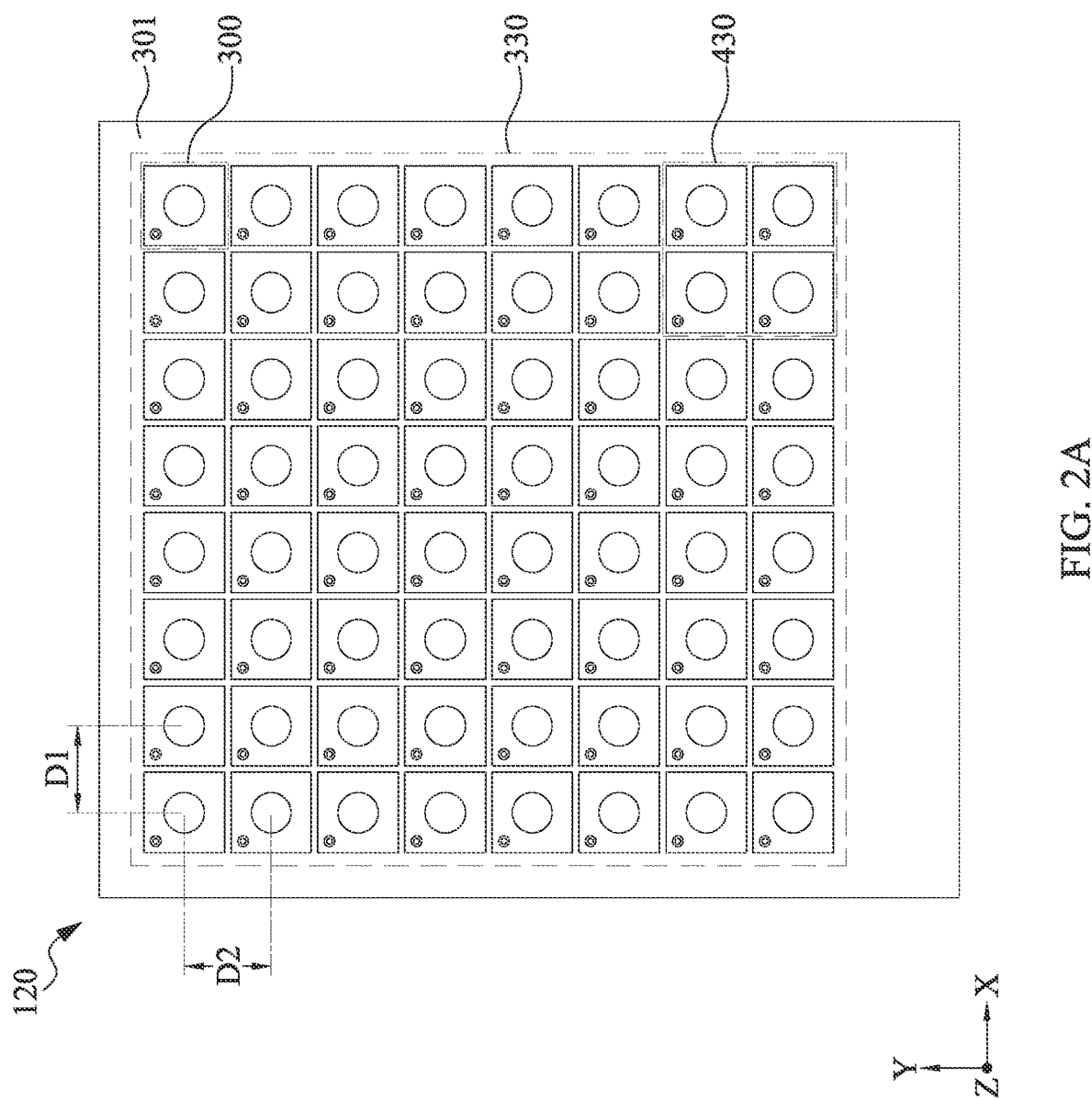
FIG. 2A is a top view of an antenna substrate of the antenna device shown in FIG. 1, in accordance with some embodiments.
Figure 2B:
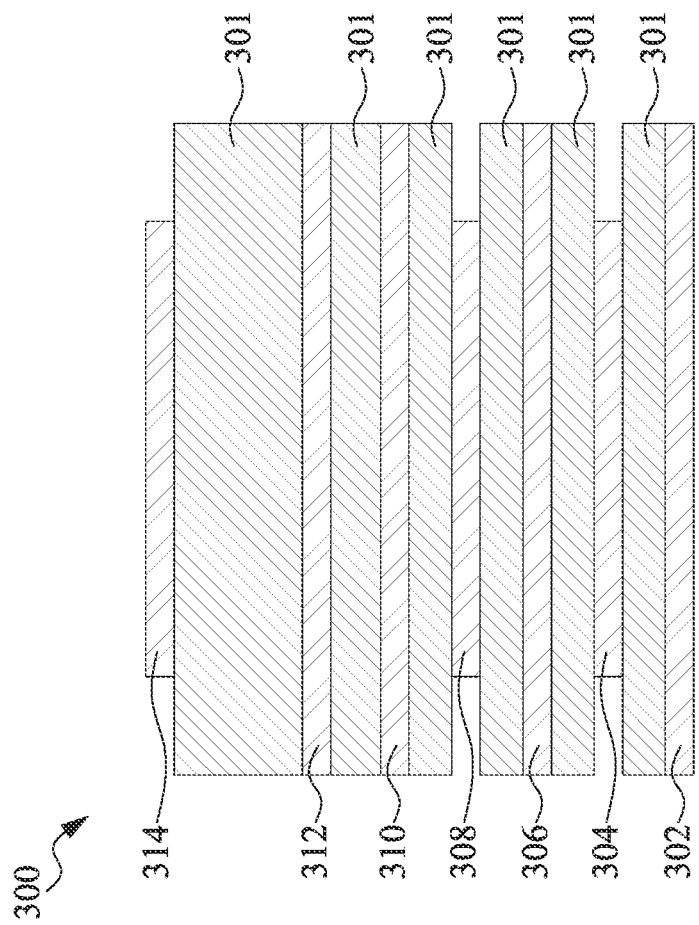
FIG. 2B is a cross-sectional view of an antenna cell of the antenna substrate shown in FIG. 2A, in accordance with some embodiments.

The circuit substrate 110 is electrically bonded to the antenna substrate 120 through the conductive layer 220. The antenna substrate 120 can be partitioned into different layers or cells in terms of the cross-sectional view or the top view thereof. As illustrated in FIG. 1, the antenna substrate 120 includes a plurality of antenna cells 300 from a cross-sectional view. Each of the antenna cells 300 is electrically coupled to the circuit substrate 110 through respective routing circuits. FIG. 2A is a top view of the antenna substrate 120 shown in FIG. 1, in accordance with some embodiments. FIG. 2B is a cross-sectional view of an antenna cell 300 shown in FIG. 2A, in accordance with some embodiments. Referring to FIG. 1 and FIG. 2A, the antenna cells 300 form the antenna array 330, in which each of the antenna cells 300 is separated or electrically insulated from each other by an insulating material of the insulating layer 301. Referring to FIG. 2A, the plurality of antenna cells 300 form a square antenna array 330 from a top-view perspective. According to some embodiments, the antenna cells 300 are individually controlled by the semiconductor chip 112 to transmit or receive one or more RF signals with respective phases and amplitudes before combining into a superimposed RF signal. Further, these antenna cells 300 are configured to function together to work like an integrated "combined" antenna to enhance the transmit gain or receive gain of the antenna device 100. Although FIG. 2A illustrates an eight-by-eight antenna array 330, it is for illustrative purposes only. Other numbers of the antenna cells 300 forming the antenna array 330 are also within the contemplated scope of the present disclosure.

According to some embodiments, a pitch D1 of the antenna cells 300 measured in a first direction, e.g., X-axis, is determined. According to some embodiments, a pitch D2 of the antenna cells 300 measured in a second direction, e.g., Y-axis, is determined. The pitch D1 may be equal to the pitch D2 to achieve substantially equal performance in difference directions. The pitch D1 or D2 may be determined to be substantially equal to or less than $\lambda/2$, wherein the symbol $\lambda$ denotes the wavelength of the RF signals RF1A, RF2A, to achieve greater antenna gain. In some other embodiments, the pitch D1 or D2 may be determined to be substantially equal to or greater than $\lambda/2$ to provide greater antenna rank.

Referring to FIG. 2B, each antenna cell 300 (or equivalently the antenna substrate 120) includes a plurality of insulating layers 301 and a plurality of conductive layers 302, 304, 306, 308, 310, 312 and 314 alternately arranged with the plurality of insulating layers 301. According to some embodiments, each of the insulating layers 301 includes an electrically insulating material or a dielectric material, e.g., ceramics, glass, or the like. According to some embodiments, each of the conductive layers 302 through 314 are formed of a conductive material, e.g., copper, aluminum, tungsten, silver and gold. The conductive layers 302 through 314 may be in a form of foil laminated with the insulating layers 301 to construct each antenna cell 300 or the antenna substrate 120.

According to some embodiments, the insulating layers 301 can allow transmission of the RF signal greater than that transmitted in the circuit substrate 110, or greater than about 10 MHz. According to some embodiments, the insulating layers 301 include a material that can allow transmission of the RF signal with a frequency up to about 40 GHz without noticeable loss. In other words, the insulating layers 301 or the antenna substrate 120 has a maximal operating frequency higher than a maximal operating frequency for the insulating layers 201A or the circuit substrate 110. Further, the substrate planarity would significantly affect the antenna performance. The material of the insulating layers 301 provides greater planarity than the material of the insulating layers 201A or 201B, and thus the circuit patterns formed on the conductive layers 302 through 314 may exhibit less deviation or distortion, especially when the planar area of the antenna substrate 120 is relatively large for accommodating the antenna array 330 with a large size. The antenna performance can thus be improved, and cost of calibrating or maintaining the antenna device 100 can therefore be reduced.

According to some embodiments, each antenna cell 300 is detachable from the antenna substrate 120 or the circuit substrate 110. When a defect is found in an antenna cell 300, such defective antenna cell 300 can be detached or debonded from the antenna substrate 120 or the circuit substrate 110 while keeping the remaining antenna cells 300 intact, or without affecting the functions of the remaining antenna cells 300 and the circuit substrate 110. According to some embodiments, the antenna array 330 is partitioned into a plurality of antenna groups 430 each including a mini antenna array formed of four (2×2) antenna cells 300. In such cases, if a defective antenna cell 300 is detected, the minimal unit of cell replacement for the antenna array 330 would be a four-cell (2×2) antenna group 430. Other number of antenna cells 300 for an antenna group 430 are also within the contemplated scope of the present disclosure.

Figure 3A:
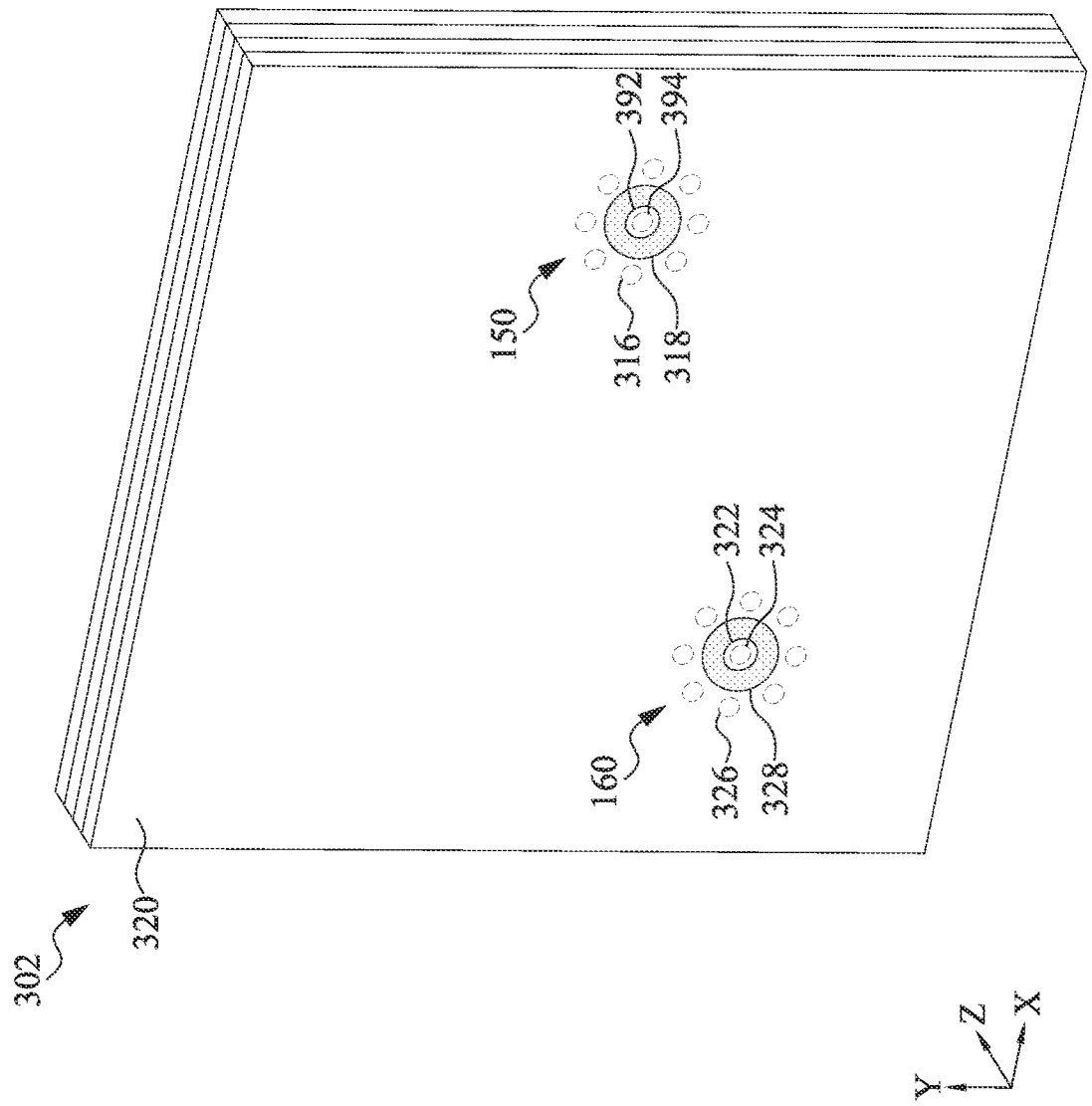
FIGS. 3A, 3B, 3C, 3D, 3E, 3F and 3G are perspective views of different conductive layers of the antenna cell shown in FIG. 2B, in accordance with some embodiments.
Figure 3B:
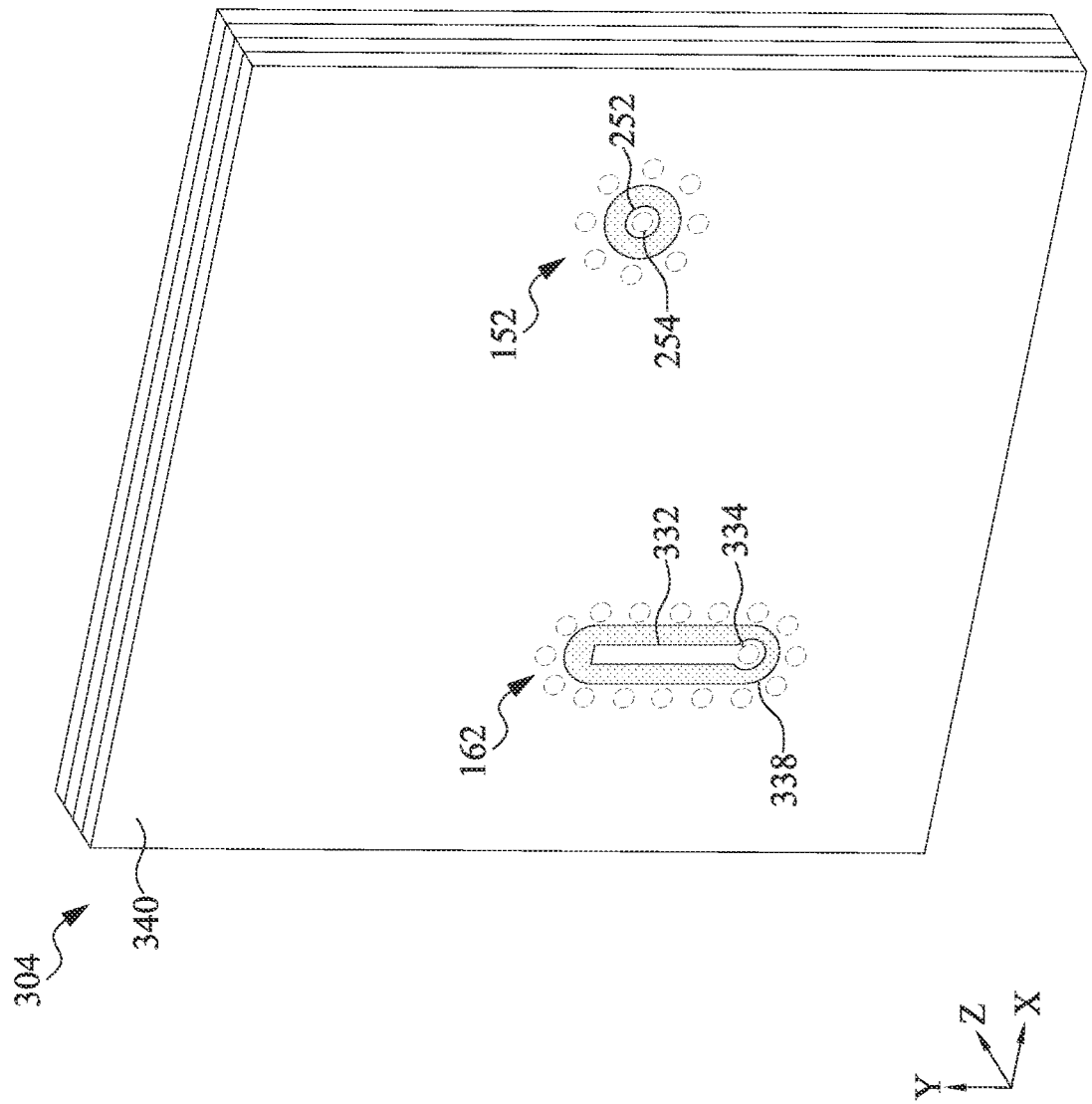
Figure 3C:
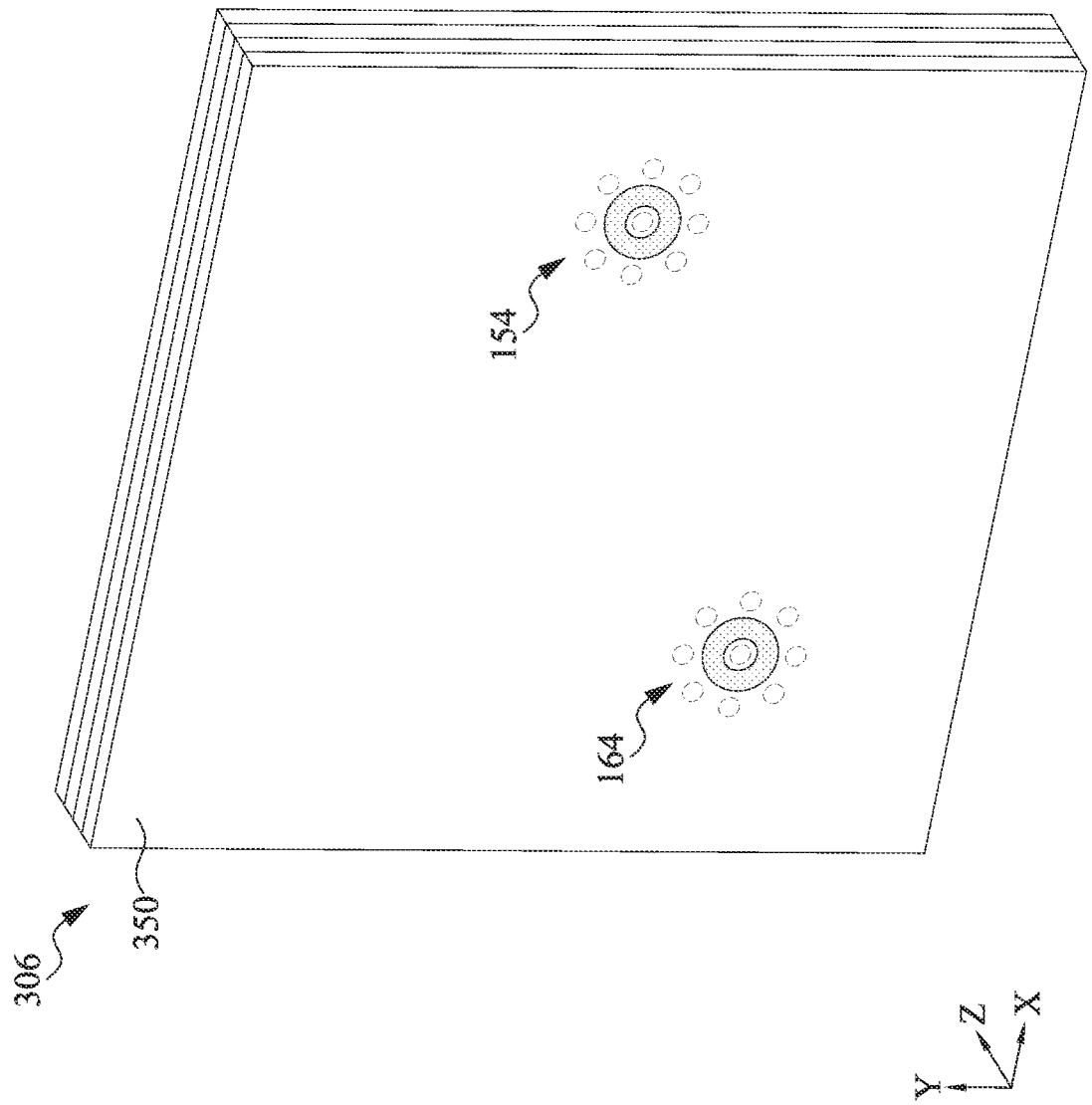
Figure 3D:
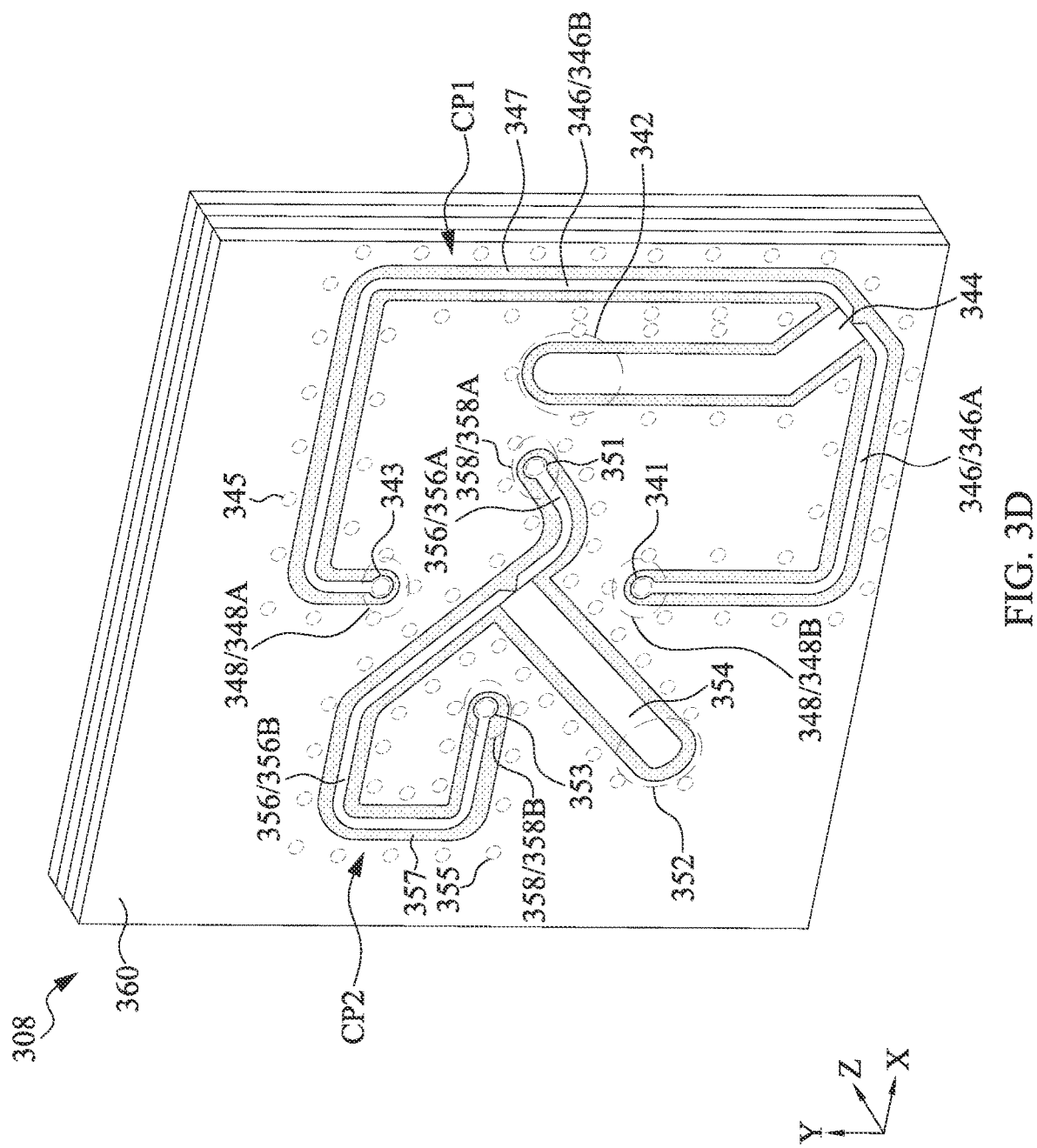
Figure 3E:
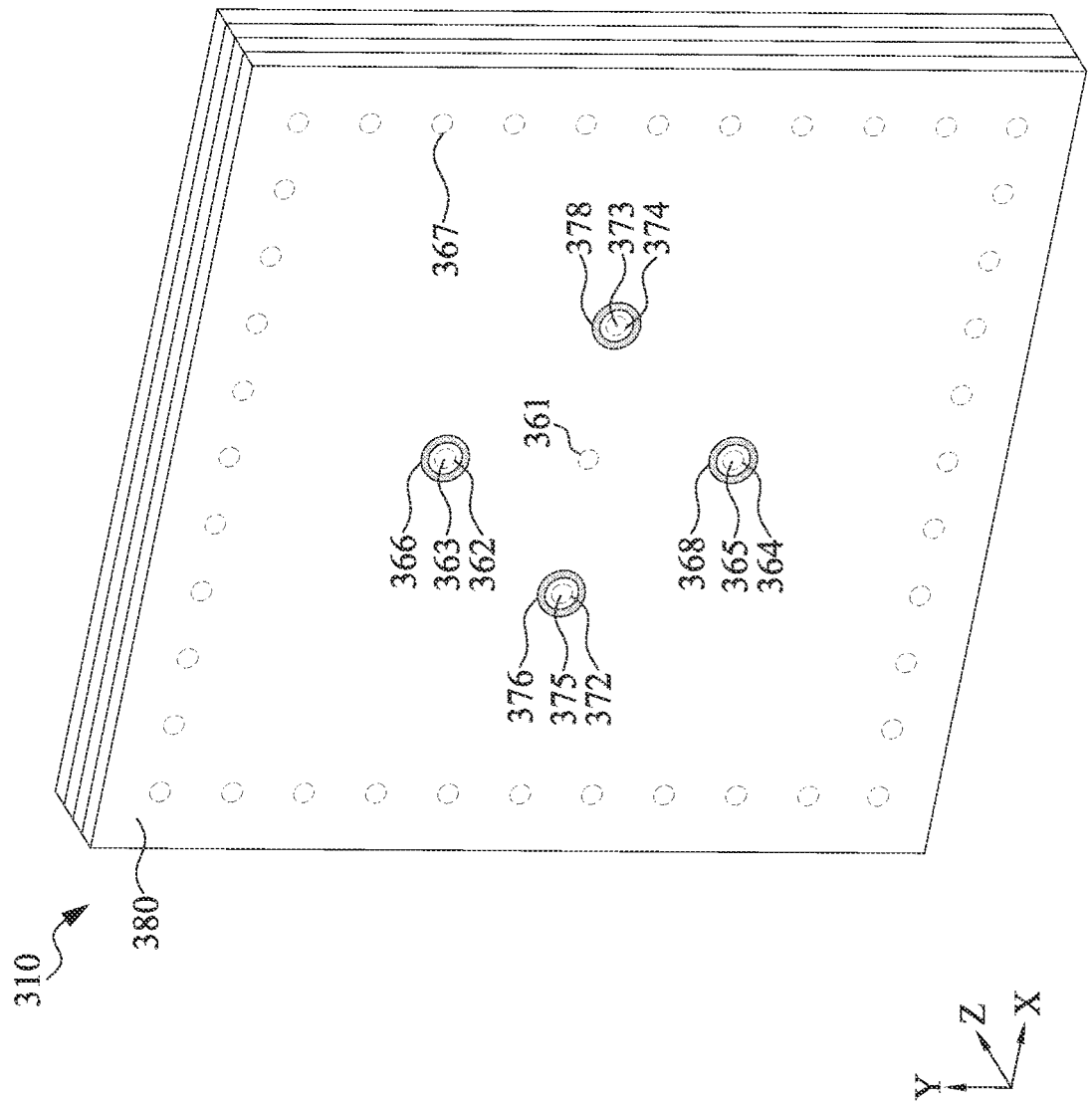
Figure 3F:
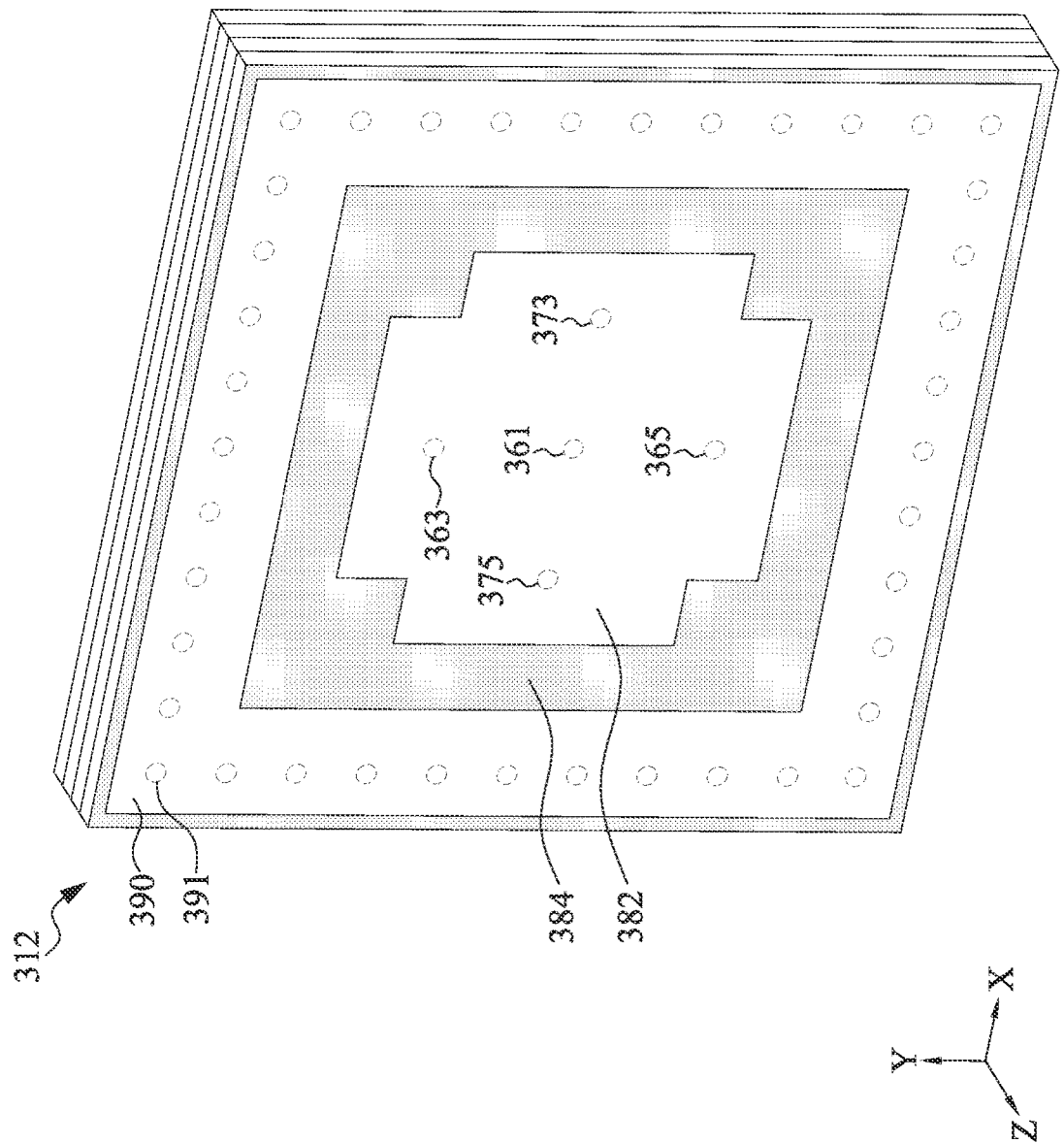
Figure 3G:
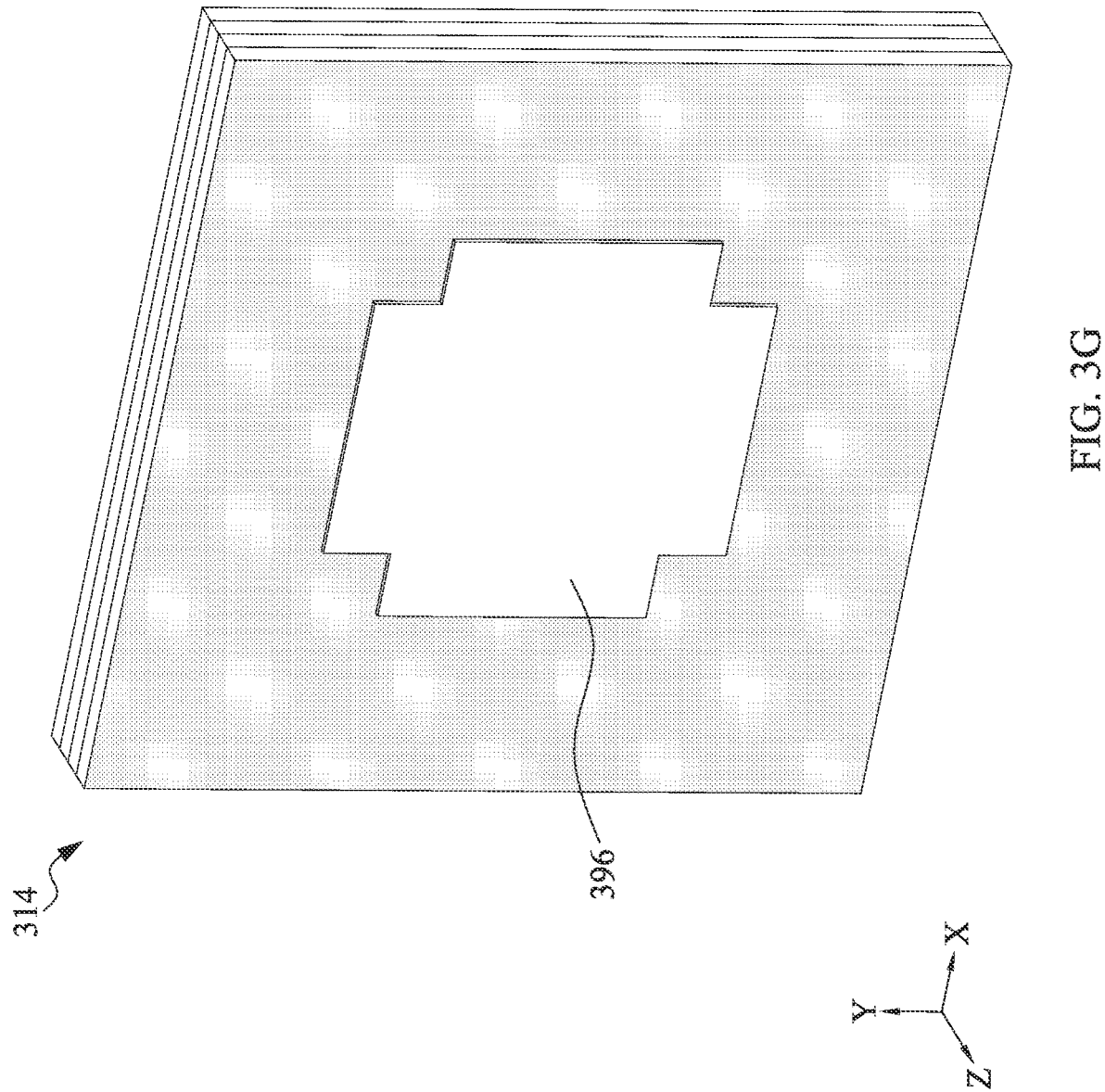

FIGS. 3A, 3B, 3C, 3D, 3E, 3F and 3G are perspective views of conductive layers 302, 304, 306, 308, 310, 312 and 314, respectively, of the antenna cell 300 shown in FIG. 2B, in accordance with some embodiments. Each conductive layer 302, 304, 306, 308, 310, 312 and 314 is illustrated along with a respective adjacent insulating layer 301. The sides shown in FIGS. 3A through 3E having circuit patterns formed thereon are the lower sides of the respective conductive layers 302 through 310, i.e., the sides facing the circuit substrate 110, while the sides of the conductive layers 312 and 314 having a circuit pattern formed thereon as shown in FIGS. 2A, 3F and 3G are the upper side of the conductive layers 312 and 314, i.e., the side facing away from the circuit substrate 110.

Referring to FIG. 3A, the conductive layer 302 is configured as a bonding layer electrically bonded to the conductive layer 220 of the circuit substrate 110. According to some embodiments, the conductive layer 302 serves as a signal input layer and includes a first signal input port 150 and a second signal input port 160. The first signal input port 150 and the second signal input port 160 are configured to receive the RF signals RF1A, RF2A from the contact pads of the circuit substrate 110 and transmit these RF signals RF1A, RF2A to the overlying conductive layers 304 through 314. The conductive layer 302 further includes a ground patch 320 laterally surrounding the first signal input port 150 and the second signal input port 160. According to some embodiments, the first signal input port 150 and the second signal input port 160 include a first contact pad 392 and a second contact pad 322, respectively, arranged on the lower side of the conductive layer 302. The first contact pad 392 and the second contact pad 322 are separated from the ground patch 320 by isolation regions 318 and 328, respectively. The isolation regions 318 and 328 may be filled with an insulating material of the insulating layer 301.

According to some embodiments, referring to FIGS. 2B and 3A, the insulating layer 301 arranged immediately over the conductive layer 302 further includes a first conductive via 394 and a second conductive via 324 extending through the insulating layer 301 and electrically connected to the first contact pad 392 and the second contact pad 322, respectively. According to some embodiments, the first contact pad 392, the second contact pad 322, the first conductive via 394 and the second conductive via 324 have a circular shape from a top-view perspective. Since the first conductive via 394 and the second conductive via 324 are not observable from the view shown in FIG. 3A, they are illustrated as dashed circles. The first contact pad 392 or the second contact pad 322 may have an area greater than the area of the first conductive via 394 or the second conductive via 324 from a top-view perspective for increasing the contact area. The first conductive via 394 and the second conductive via 324 may be formed of a conductive material, e.g., copper, tungsten, aluminum, silver, gold, or the like.

According to some embodiments, as shown in FIG. 3A, the insulating layer 301 arranged immediately over the conductive layer 302 further includes a plurality of third conductive vias 316 and a plurality of fourth conductive vias 326 extending through the insulating layer 301 and electrically connecting the ground patch 320 to a ground layer or a ground terminal of the circuit substrate 110. The third conductive vias 316 and the fourth conductive vias 326 may also be referred to herein as ground vias. The first contact pad 392 or the second contact pad 322 may have an area greater than the area of the third conductive vias 316 or the fourth conductive vias 326 from a top-view perspective. According to some embodiments, the third conductive vias 316 and the fourth conductive vias 326 laterally surround the first signal input port 150 and the second signal input port 160, respectively. The third conductive vias 316 and the fourth conductive vias 326 may be formed of a conductive material, e.g., copper, tungsten, aluminum, silver, gold, or the like.

Referring to FIG. 3B, the conductive layer 304 is configured as a first feeding network layer and used to transmit a pair of first feeding signals, i.e., the RF signals RF1A and RF2A, respectively. The conductive layer 304 includes a first signal input port 152 and a second signal input port 162. The first signal input port 152 and the second signal input port 162 are configured to receive the RF signals RF1A, RF2A from the conductive layer 302 and transmit the same to the overlying conductive layers 306 through 314. The conductive layer 304 further includes a ground patch 340 laterally surrounding the first signal input port 152 and the second signal input port 162. The first signal input port 152 and the second signal input port 162 are similar to the first signal input port 150 and the second signal input port 160 in many aspects, and these similar aspects will not be repeated for brevity. Further, the conductive pads of the first signal input port 152 and the second signal input port 162 are aligned with those of the first signal input port 150 and the second signal input port 160, respectively, from a top-view perspective.

According to some embodiments, the first signal input port 152 has a contact pad 252 electrically connected to a conductive via 254. According to some embodiments, the second signal input port 162 includes a contact pad 332 electrically insulated from the ground patch 340 through an isolation region 338. The conductive layer 304 further includes a conductive via 334 extending through its adjacent overlying insulating layer 301 and electrically connected to the contact pad 332. The difference between the second signal input port 162 and the first signal input port 152 lies in that the contact pad 252 of the first signal input port 152 has a circular shape, while the contact pad 332 of the second signal input port 162 includes an elongated shape, e.g., a bar shape or a strip shape, from a top-view perspective to achieve desirable electrical properties of the RF signals RF1A, RF2A.

Referring to FIG. 3C, the conductive layer 306 is configured as a ground layer and used to provide a reference (grounding) level to the antenna cell 300, e.g., providing a reference ground to the first feeding network layer 304. The conductive layer 306 includes a first signal input port 154 and a second signal input port 164. The first signal input port 154 and the second signal input port 164 are configured to receive the RF signals RF1A, RF2A from the conductive layer 304 and transmit the RF signals RF1A, RF2A to the overlying conductive layers 308 through 314. The conductive layer 306 further includes a ground patch 350 laterally surrounding the first signal input port 154 and the second signal input port 164. The configurations and materials of the first signal input port 154 and the second signal input port 164 are similar to those of the first signal input port 150 and the second signal input port 160 in many aspects, and these similar aspects will not be repeated for brevity. Further, the conductive pads of the first signal input port 154 and the second signal input port 164 are aligned with those of the first signal input port 150 and the second signal input port 160, respectively, and aligned with those of the first signal input port 152 and the second signal input port 162, respectively, from a top-view perspective. According to some embodiments, the contact pads of the first signal input port 154 and the second signal input port 164 have a circular shape.

Referring to FIG. 3D, the conductive layer 308 is configured as a second feeding network layer and used to generate two pairs of second feeding signals, referred to herein as RF1P, RF1N and RF2P, RF2N, based on the first feeding signals RF1A and RF2A. According to some embodiments, the conductive layer 308 includes a first signal input port 342 and a second signal input port 352, as illustrated by dashed circles in FIG. 3D. The first signal input port 342 and the second signal input port 352 are configured to receive the pair of first feeding signals RF1A and RF2A from the conductive layer 304, convert these RF signals RF1A, RF2A into two pairs of second feeding signals and transmit the same to a first signal output port 348A, a second signal output port 348B, a third signal output port 358A and a fourth signal output port 358B as the two pairs of the second feeding signals RF1P, RF1N, RF2P and RF2N. The signal output ports 348A, 348B, 358A and 358B are electrically connected to respective conductive vias 341, 343, 351 and 353, which are formed through its adjacent overlying insulating layer 301 and electrically connected to the overlying conductive layers 310 through 314. Further, the end portions of the first signal input port 342 and the second signal input port 352 are aligned with the conductive pads of the first signal input port 154 and the second signal input port 164, respectively.

According to some embodiments, the first pair of second feeding signals RF1P, RF1N are generated through a first conduction path CP1 starting from an end portion of the first signal input port 342 toward the end portions of the first signal output port 348A and the second signal output port 348B through a first conductive segment 344 and two respective second conductive segments 346 (e.g., second conductive segments 346A and 346B). According to some embodiments, the first RF signal pair of the second feeding signals RF1P, RF1N are determined to have substantially equal amplitudes and antipodal phases, i.e., having identical signals with a phase difference of substantially 180 degrees. The first pair of second feeding signals RF1P, RF1N are therefore referred to herein as a first RF signal pair of linear polarization. According to some embodiments, under the consideration of the frequency (or wavelength) of the RF signal, the length difference between the second conductive segment 346A and the second conductive segment 346B are determined such that the two identical signals RF1P and RF1N transmitted from the first conductive segment 344 and traveling across the respective second conductive segments 346A and 346B would be different from each other by a phase difference of substantially 180 degrees.

According to some embodiments, the phases of the first pair of the second feeding signals RF1P and RF1N are offset with the second pair of the second feeding signals RF2P and RR2N by +90 or −90 degrees for generating an RF signal with circular polarization. For example, the two pairs of the second feeding signals RF1P, RF2P, RF1N and RF2N at the signal output ports 348A, 358A, 348B and 358B are offset with respect to a reference signal by zero, 90, 180 and 270 degrees, respectively. The offset phase value of +90 or −90 degrees between the first pair of the second feeding signals RF1P and RF1N and the second pair of the second feeding signals RF2P and RR2N may cause the radiated RF signal combined by the second feeding signals RF1P, RF1N, RF2P and RF2N to be a combined RF signal transmitted with a right-hand circular polarization or a left-hand circular polarization.

The first conductive segment 344 may have a width greater than a width of the second conductive segments 346A and 346B. According to some embodiments, the second conductive segment 346A or 346B may have a length greater than or less than that of the first conductive segment 344.

According to some embodiments, the second pair of second feeding signals RF2P, RF2N are generated through a second conduction path CP2 starting from the end portion of the second signal input port 352 toward the end portion of the third signal output port 358A and the fourth signal output port 358B through a first conductive segment 354 and two respective second conductive segments 356 (e.g., second conductive segments 356A and 356B). According to some embodiments, the second RF signal pair of the second feeding signals RF2P, RF2N are determined to have substantially equal amplitudes and antipodal phases, i.e., having identical signals with a phase difference of substantially 180 degrees. The second pair of second feeding signals RF2P, RF2N are therefore referred to herein as a second RF signal pair of linear polarization. According to some embodiments, under the consideration of the frequency (or wavelength) of the RF signal, the length difference between the second conductive segment 356A and the second conductive segment 356B are determined such that the two identical signals RF2P and RF2N transmitted from the first conductive segment 354 and traveling across these two second conductive segments 356A and 356B would be different from each other by a phase difference of substantially 180 degrees.

The first conductive segment 354 may have a width greater than a width of the second conductive segments 356A and 356B. According to some embodiments, the second conductive segment 356A or 356B may have a length greater than or less than the first conductive segment 354.

According to some embodiments, the signal output ports 348A, 348B of the first pair of second feeding signals RF1P, RF1N are arranged on two ends of a hypothetical vertical line, while the signal output ports 358A, 358B of the second pair of second feeding signals RF2P, RF2N are arranged on two ends of a hypothetical horizontal line. The arrangement of the signal output ports of different signal pairs at mutually orthogonal lines would reduce the cross-polarization interference. According to some embodiments, the first pair of the second feeding signals RF1P and RF1N are in a vertical polarization, while the second pair of the second feeding signals RF2P and RF2N are in a horizontal polarization, or vice versa.

The conductive layer 308 may further include a ground patch 360 laterally surrounding the first conduction path CP1 and the second conduction path CP2 and electrically isolated from the first conduction path CP1 and the second conduction path CP2 by isolation regions 347 and 357, respectively. The isolation regions 347 and 357 may include an elongated shape or a curved shape, e.g., the isolation regions 347 and 357 are conformal to the patterns of the first conduction path CP1 and the second conduction path CP2, respectively.

According to some embodiments, the insulating layer 301 immediately over the conductive layer 308 further includes a plurality of fifth conductive vias 345 and a plurality of sixth conductive vias 355 extending through the insulating layer 301 and electrically connecting the ground patch 360 to a ground layer or a ground terminal of the antenna substrate 120 or the circuit substrate 110. The fifth conductive vias 345 and the sixth conductive vias 355 may also be referred to herein as ground vias. The first conductive segments 344, 354 and the second conductive segments 346, 356 may have a width greater than a width of the fifth conductive vias 345 or the sixth conductive vias 355 from a top-view perspective. According to some embodiments, the fifth conductive vias 345 and the sixth conductive vias 355 are close to the isolation regions 347 and 357, respectively, to form a ring to laterally surround the first conduction path CP1 and the second conduction path CP2, respectively. The fifth conductive vias 345 and the sixth conductive vias 355 may be formed of a conductive material, e.g., copper, tungsten, aluminum, silver, gold, or the like.

Referring to FIG. 3E, the conductive layer 310 is configured as a ground layer and used to provide a reference (grounding) level to the antenna cell 300, e.g., providing a reference ground to the conductive layers 312 and 314. The conductive layer 310 includes a first contact pad 362, a second contact pad 364 configured as a first signal input port and a second signal input port, respectively, and electrically connected to the first pair of second feeding signals RF1P and RF1N, respectively, at the signal output ports 348A and 348B, respectively, of the conductive layer 308. Similarly, The conductive layer 310 further includes a third contact pad 372, a fourth contact pad 374 configured as a third signal input port and a fourth signal input port, respectively, and electrically connected to the second pair of second feeding signals RF2P and RF2N, respectively, at the signal output ports 358A and 358B, respectively, of the conductive layer 308. The first contact pad 362 and the second contact pad 364 are configured to receive the first pair of second feeding signals RF1P, RF1N from the conductive layer 308 and transmit the first pair of second feeding signals RF1P, RF1N to the overlying conductive layers 312 and 314. Likewise, the third contact pad 372 and the fourth contact pad 374 are configured to receive the second pair of second feeding signals RF2P, RF2N from the conductive layer 308 and transmit the second pair of second feeding signals RF2P, RF2N to the overlying conductive layers 312 and 314.

According to some embodiments, the conductive layer 310 further includes a ground patch 380 laterally surrounding the contact pads 362, 364, 372 and 374. Further, the ground patch 380 is electrically isolated from the contact pads 362, 364, 372 and 374 by isolation regions 366, 368, 376 and 378, respectively. According to some embodiments, the contact pads 362, 364, 372 and 374 have a circular shape, and the isolation regions 366, 368, 376 and 378 have a circular shape. According to some embodiments, the insulating layer 301 immediately adjacent to the conductive layer 310 further includes a conductive via 361 electrically connected to the ground patch 380 and configured as a ground via and used to provide a reference grounding level to the conductive layers 312 and 314.

Referring to FIG. 3F, the conductive layer 312 is configured as a driving antenna layer and used to generate or radiate an (RF) antenna signal according to the two pairs of second feeding signals RF1P, RF1N, RF2P and RF2N provided from the contact pads 362, 364, 372 and 374 of the conductive layer 310 through the conductive vias 363, 365, 373 and 375 through the insulating layer 301 between the conductive layers 310 and 312. According to some embodiments, the conductive layer 312 includes an antenna patch 382 arranged at a center of the conductive layer 312. The conductive layer 312 may further include a ground patch 390 having a ring shape arranged on a periphery of the conductive layer 312 and laterally surrounding the antenna patch 382. The antenna patch 382 is electrically isolated from the ground patch 390 by an isolation region 384. The antenna patch 382 may include a cross shape, where the four sides of the cross are parallel with the four boundary sides of the antenna cell 300 or the conductive layer 312.

According to some embodiments, the two pairs of second feeding signals are fed to the four wings of the antenna patch 382 through the respective conductive vias 363, 365, 373 and 375. As a result, the antenna patch 382 is configured to generate and radiate an antenna signal to the conductive layer 314, wherein the antenna signal includes two pairs of second feeding signals RF1P, RF1N, RF2P and RF2N, and the first pair of second feeding signals RF1P and RF1N are independent of the second pair of second feeding signals RF2P and RF2N. Further, according to some embodiments, the ground via 361 is electrically coupled to a center of the antenna patch 382 to set the voltage potential of the antenna patch 382 at its center to be the ground level for enhancing the cross-polarization isolation performance.

Referring to FIG. 3G, the conductive layer 314 is configured as a radiating antenna layer and electromagnetically coupled to the driving antenna layer 312. The conductive layer 314 may be electromagnetically receive the RF signal generated by the antenna patch 382 of the driving antenna layer 312 and radiate the RF signal. According to some embodiments, the conductive layer 314 includes an antenna patch 396 arranged at the center of the conductive layer 314. The antenna patch 396 may have a cross shape. The antenna patch 396 may be aligned with and fully overlapped with the antenna patch 382 from a top-view perspective. According to some embodiments, the conductive layer 314 is free from any ground patch and may be laterally surrounded by the insulating material of the insulating layers 301.

Figure 4A:
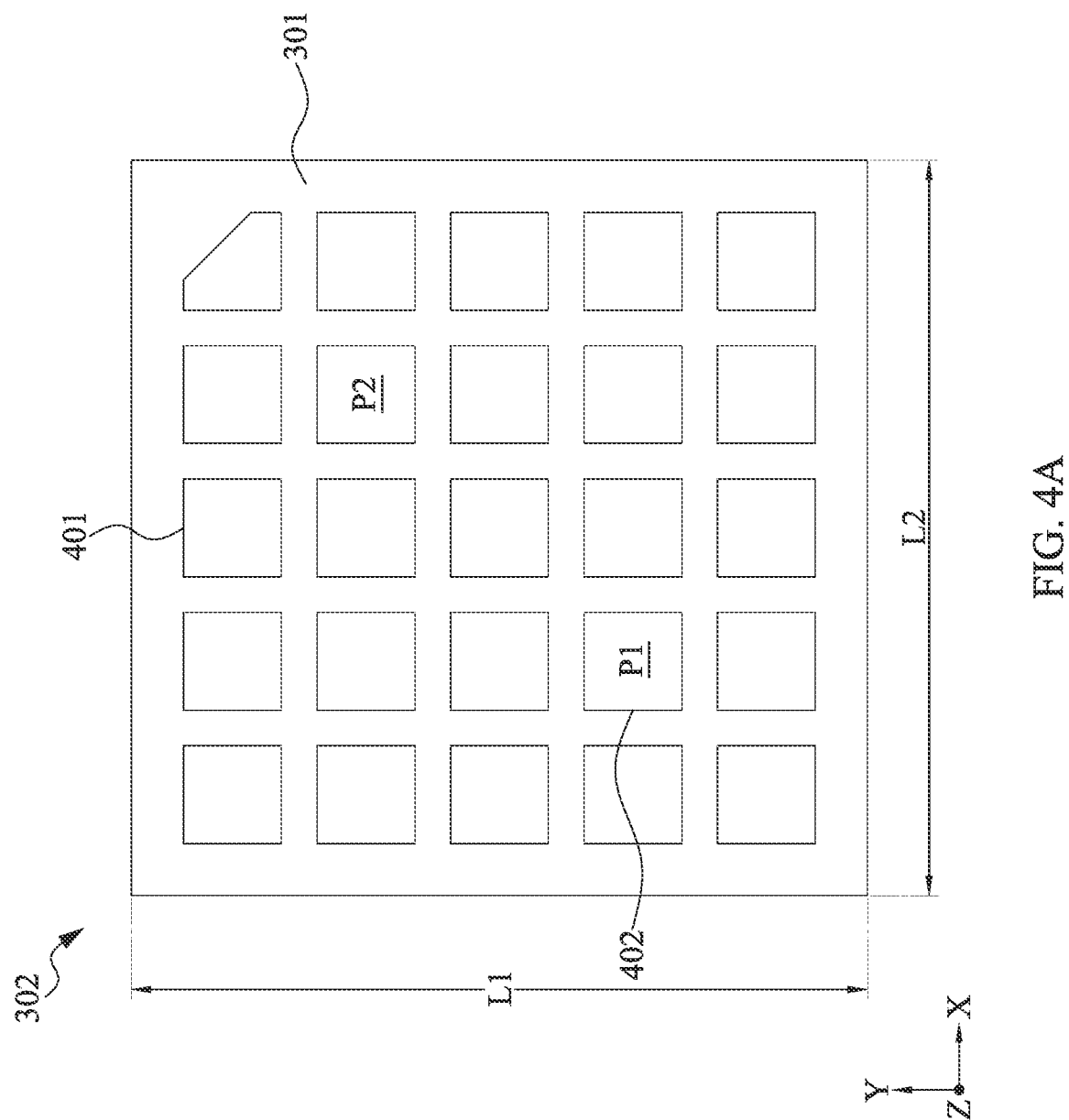
FIGS. 4A and 4B are bottom views of a bonding layer of the antenna cell shown in FIG. 2A or FIG. 2B, in accordance with some embodiments.
Figure 4B:
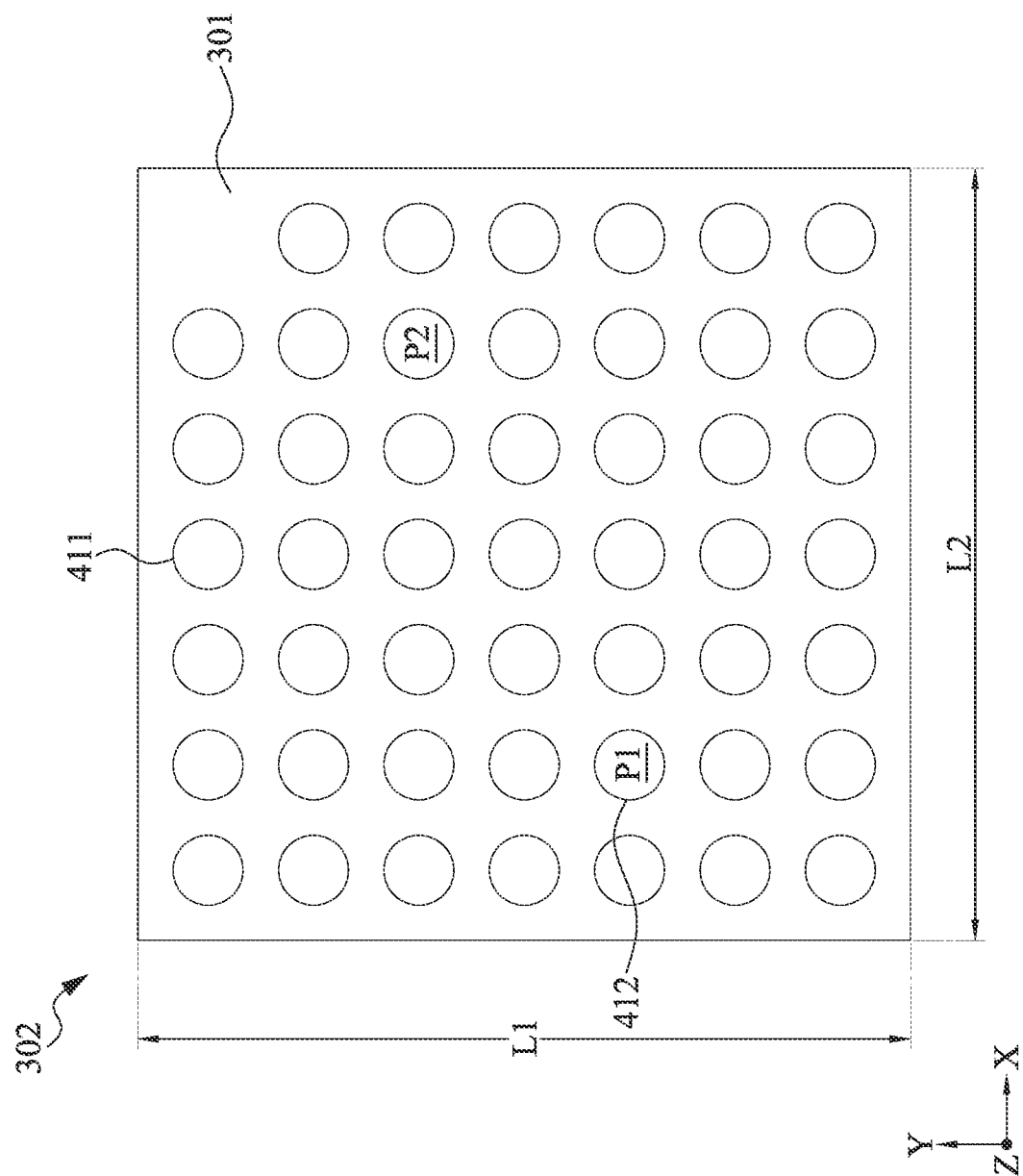

FIGS. 4A and 4B are bottom views of the bonding layer 302 of the antenna cell 300 shown in FIG. 2A or FIG. 2B, in accordance with some embodiments. Referring to FIG. 4A, the bonding layer 302 includes an array of conductive pads 401 and 402 arranged on a lower side of the bonding layer 302 and configured as contact pads for electrically coupled to the bonding layer 220 of the circuit substrate 110. The conductive pads 401, 402 may have a square shape or a rectangular shape. According to some embodiments, the conductive pads 401 and 402 have substantially equal widths or areas from a bottom-view perspective. The conductive pads 401 are configured as ground patches to provide a reference grounding level to the antenna cell 300, while the conductive pads 402 are configured to be electrically connected to the bonding layer 220 for receiving the RF signals RF1A, RF2A from the circuit substrate 110. The conductive pads 402 includes a first signal input pad P1 and a second signal input pad P2 configured to receive the pair of the first feeding signals RF1A, RF2A. The bonding layer 302 may further include the insulating layer 301 to laterally surround the array of conductive pads 401, 402 and electrically isolate each of the conductive pads 401, 402 from each other.

According to some embodiments, the antenna substrate 120 shown in FIG. 2B and FIGS. 3A to 3G is provided as an exemplary transmitter. However, the antenna substrate 120 can also be configured as a receiver, wherein an RF signal is received from the ambient environment and transmitted to the circuit substrate 110 via a signal path. The signal path starts from the conductive layer 314, through the conductive layers 312, 310, 308, 306 and 304, and reaches the conductive layer 302. The order of RF signal transmission and processing for the receiver may be reversed to that for the transmitter.

Referring to FIGS. 4A and 4B, a length L1 or a width L2 of a single antenna cell 300 or a conductive layer 302 may be determined to be greater than or less than 2I2, wherein the symbol λ denotes the wavelength of the RF signals RF1A, RF2A. According to some embodiments, a length or a width of the conductive pads 402 is determined based on λ and parasitic capacitance related to the conductive pad 402. For example, the length or the width of the conductive pad 402 is in a range between about 0.2 mm and about 1 mm, e.g., about 0.5 mm. Referring to FIG. 4B, according to some embodiments, a diameter or a width of the conductive pads 411, 412 is in a range between about 0.2 mm and about 1.6 mm, e.g., 0.9 mm. According to some embodiments, a pitch of the conductive pads 411 or a pitch between a conductive pad 411 and a conductive pad 412 is in a range between about 0.2 mm and about 1.6 mm, e.g., 0.9 mm.

The array of the conductive pads 401, 402 may be directly coupled or bonded to the bonding layer 220 of the circuit substrate 110. Although not separately shown, the bonding layer 220 of the circuit substrate 110 also has an array of conductive pads corresponding to the conductive pads 401, 402. The circuit substrate 110 is bonded to the antenna substrate 120 through the bonding of the conductive pads 401, 402 of the bonding layer 302 with the corresponding conductive pads of the bonding layer 220. According to some embodiments, the array of conductive pads 401, 402 of the bonding layer 302 or that of the bonding layer 220 are referred to herein as land grid array (LGA).

Referring to FIG. 4B, the bonding layer 302 is similar to the bonding layer 302 shown in FIG. 4A, except that the bonding layer 302 shown in FIG. 4B includes conductive pads 411, 412, where the conductive pads 411, 412 may have a circular shape or an oval shape. According to some embodiments, the conductive pads 411 and 412 have substantially equal radiuses or areas from a bottom-view perspective. The conductive pads 411 are configured as ground patches to provide a reference grounding level to the antenna cell 300, while the conductive pads 412 are configured to be electrically connected to the circuit substrate 110 for receiving the RF signals RF1A, RF2A. The conductive pads 412 includes a first contact pad P1 and a second contact pad P2 configured to receive the pair of the first feeding signals RF1A, RF2A from the circuit substrate 110. The bonding layer 302 may further include the insulating layer 301 to laterally surround the array of conductive pads 411, 412 and electrically isolate each of the conductive pads 411, 412 from each other. According to some embodiments, the array of conductive pads 411, 412 is also referred to herein as the LGA.

Figure 5A:
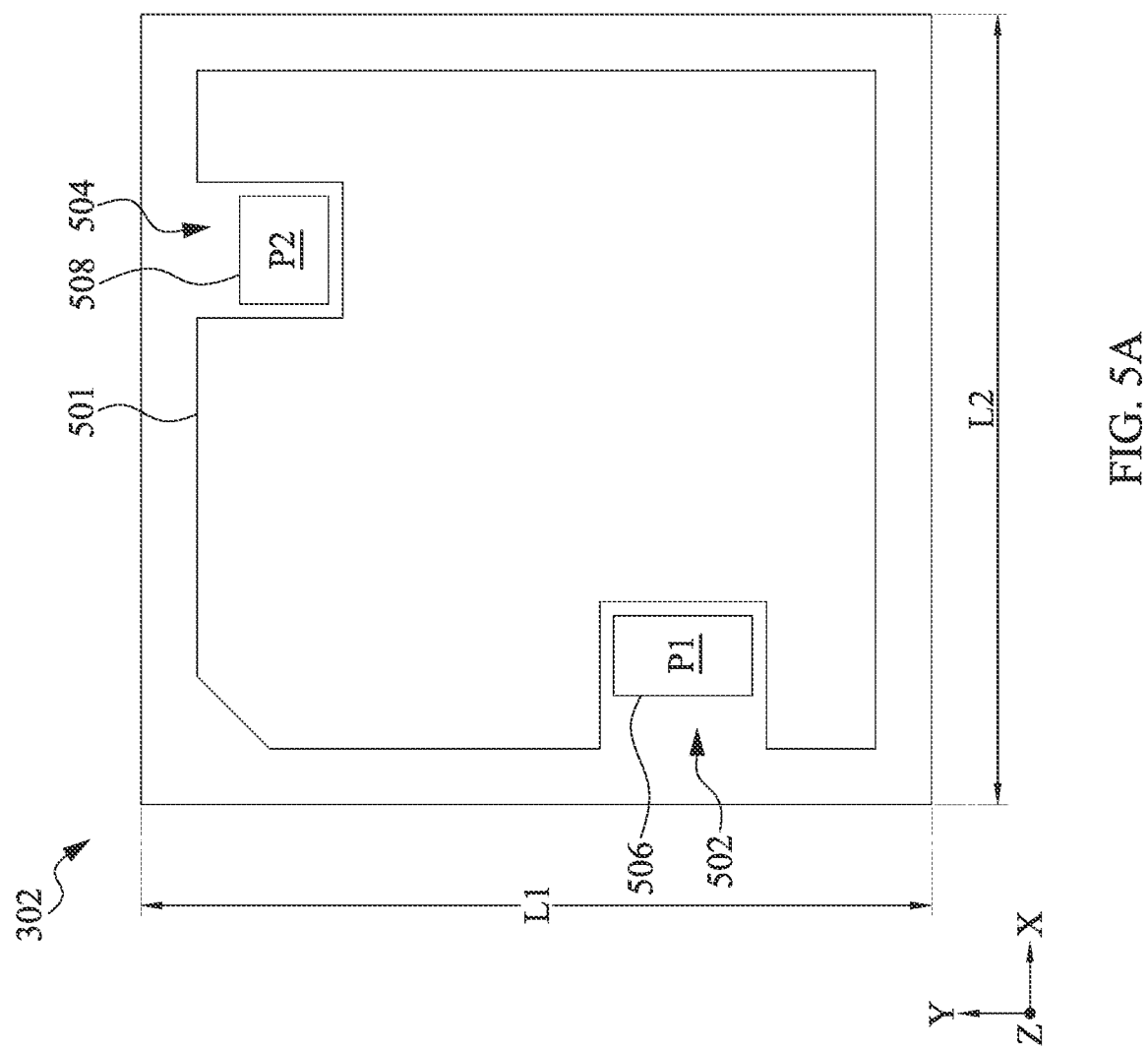
FIGS. 5A and 5B are bottom views of a bonding layer of the antenna cell shown in FIG. 2A or FIG. 2B, in accordance with various embodiments.
Figure 5B:
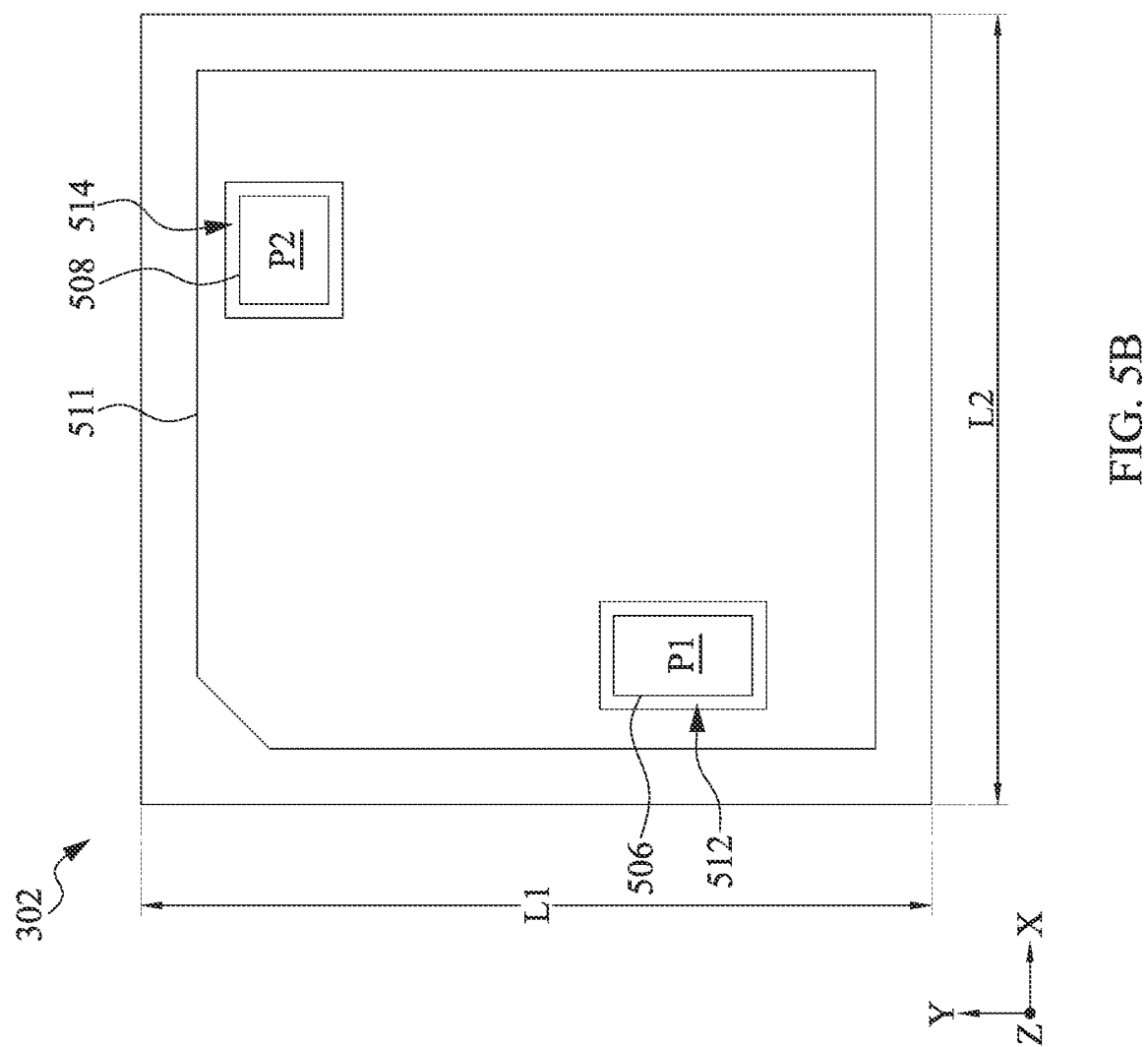

FIGS. 5A and 5B are bottom views of the bonding layer 302 of the antenna cell 300 shown in FIG. 2A or FIG. 2B, in accordance with various embodiments. Referring to FIG. 5A, the bonding layer 302 includes a ground patch 501 and conductive pads (contact pads) 506, 508 arranged on the lower side of the bonding layer 302. The ground patch 501 may include two recesses 502 and 504 for accommodating the conductive pads 506 and 508. The ground patch 501 is configured to provide a reference grounding level to the antenna cell 300, while the conductive pads 506, 508 are configured to be electrically connected to the bonding layer 220. The conductive pads 506 and 508 correspond to the first contact pad P1 and the second contact pad P2 and configured to receive the pair of the first feeding signals RF1A, RF2A from the circuit substrate 110. The conductive pads 506, 508 may have a rectangular shape, or a circular shape. The conductive layer 302 may further include the insulating layer 301 to laterally surround the ground patch 501 and the conductive pads 506, 508 and electrically isolate each of the conductive pads 506, 508 from each other and from the ground patch 501.

Referring to FIG. 5B, the configuration of the conductive layer 302 shown in FIG. 5B is similar to that shown in FIG. 5A, and these similar features will not be repeated for brevity. The conductive layer 302 shown in FIG. 5B is different from that shown in FIG. 5A in that a ground patch 511, corresponding to the ground patch 501, includes two openings 512 and 514 serving the function similar to the recesses 502 and 504, i.e., for accommodating the conductive pads 506 and 508. The conductive pads 506, 508 may have a rectangular shape, or a circular shape. The conductive layer 302 may further include the insulating layer 301 to laterally surround the ground patch 511 and the conductive pads 506, 508 and electrically isolate each of the conductive pads 506, 508 from each other and from the ground patch 511.

Figure 5C:
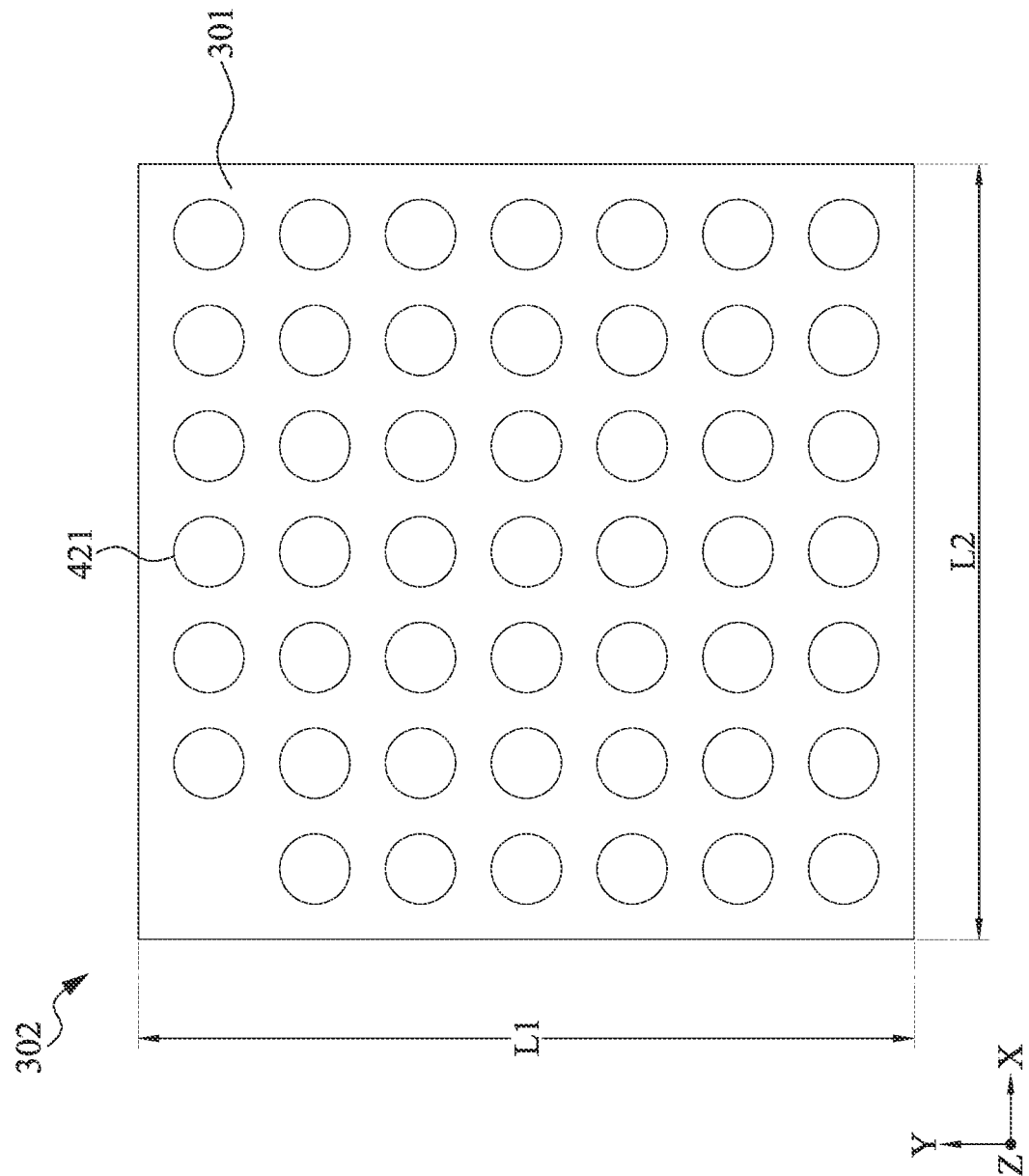
FIG. 5C is a bottom view of a bonding layer of the antenna cell shown in FIG. 2A or FIG. 2B, in accordance with various embodiments.
Figure 5D:
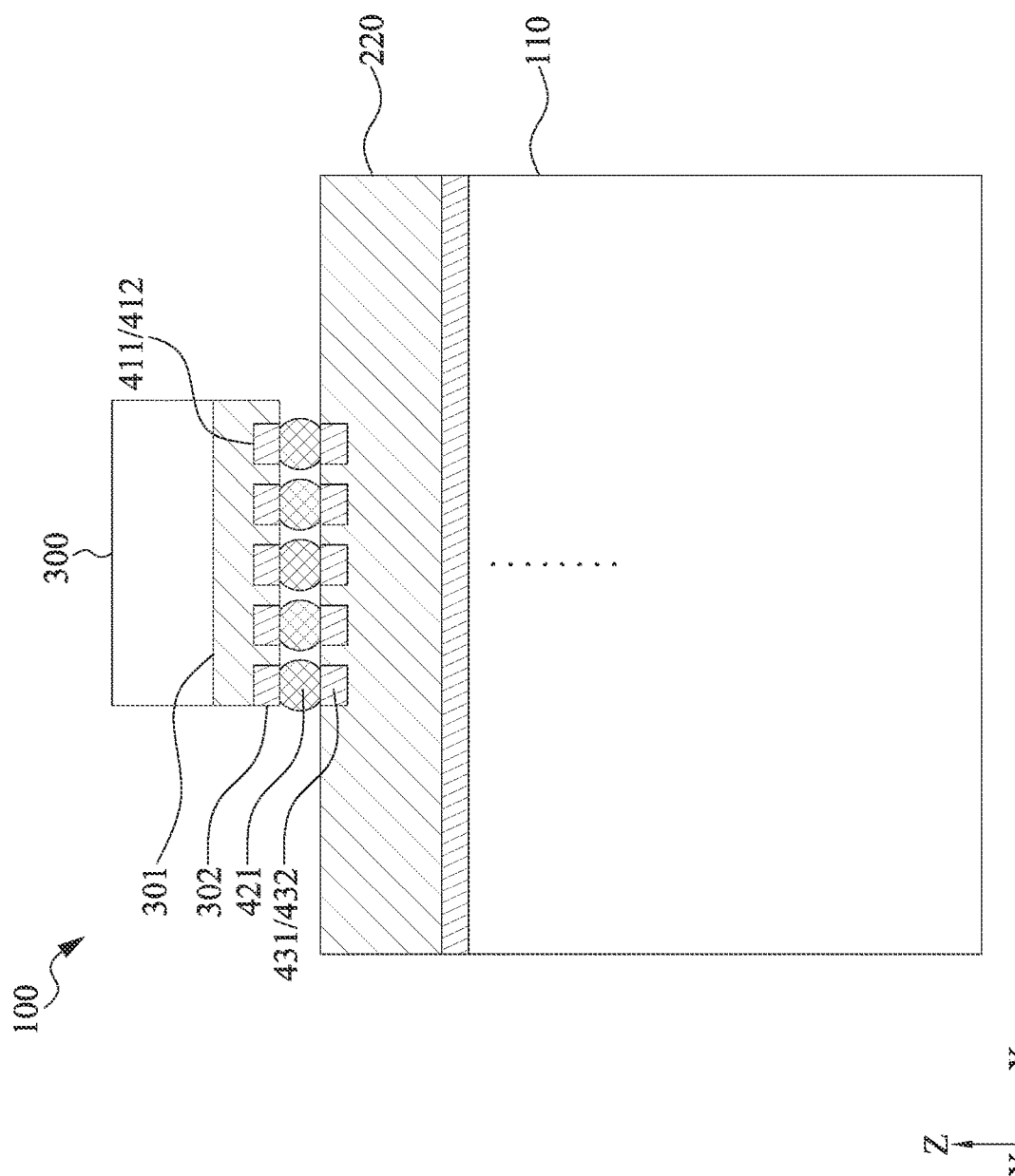
FIG. 5D is a cross-sectional view of a bonding structure of the antenna device 100, in accordance with various embodiments.

FIG. 5C is a bottom view of a bonding layer 302 of the antenna cell 300 shown in FIG. 2A or FIG. 2B, in accordance with various embodiments. FIG. 5D is a cross-sectional view of a bonding structure of the antenna device 100, in accordance with various embodiments. The bonding layer 302 shown in FIG. 5C is similar to that shown in FIG. 5B, and thus these similar features will not be repeated for brevity. According to some embodiments, referring to FIGS. 5C and 5D, the antenna device 100 further includes a plurality of connectors 421 electrically bonded to the conductive pads 411 and 412 (not separately shown in FIG. 5C, but illustrated in FIGS. 4B and 5D) of the bonding layer 302, and electrically bonded to the conductive pads 431 (ground patch) and conductive pads 432 (signal pad). The connectors 421 may include a solder material formed of lead-based materials, such as Sn, Pb, Ni, Au, Ag, Cu, Bi, combinations thereof, or mixtures of other electrically conductive materials. According to some other embodiments, the connectors 421 includes a lead-free material. The connectors 421 may include conductive bumps configured as contact bumps, such as C4 bumps, ball grid array (BGA) bumps, or microbumps.

Figure 6:
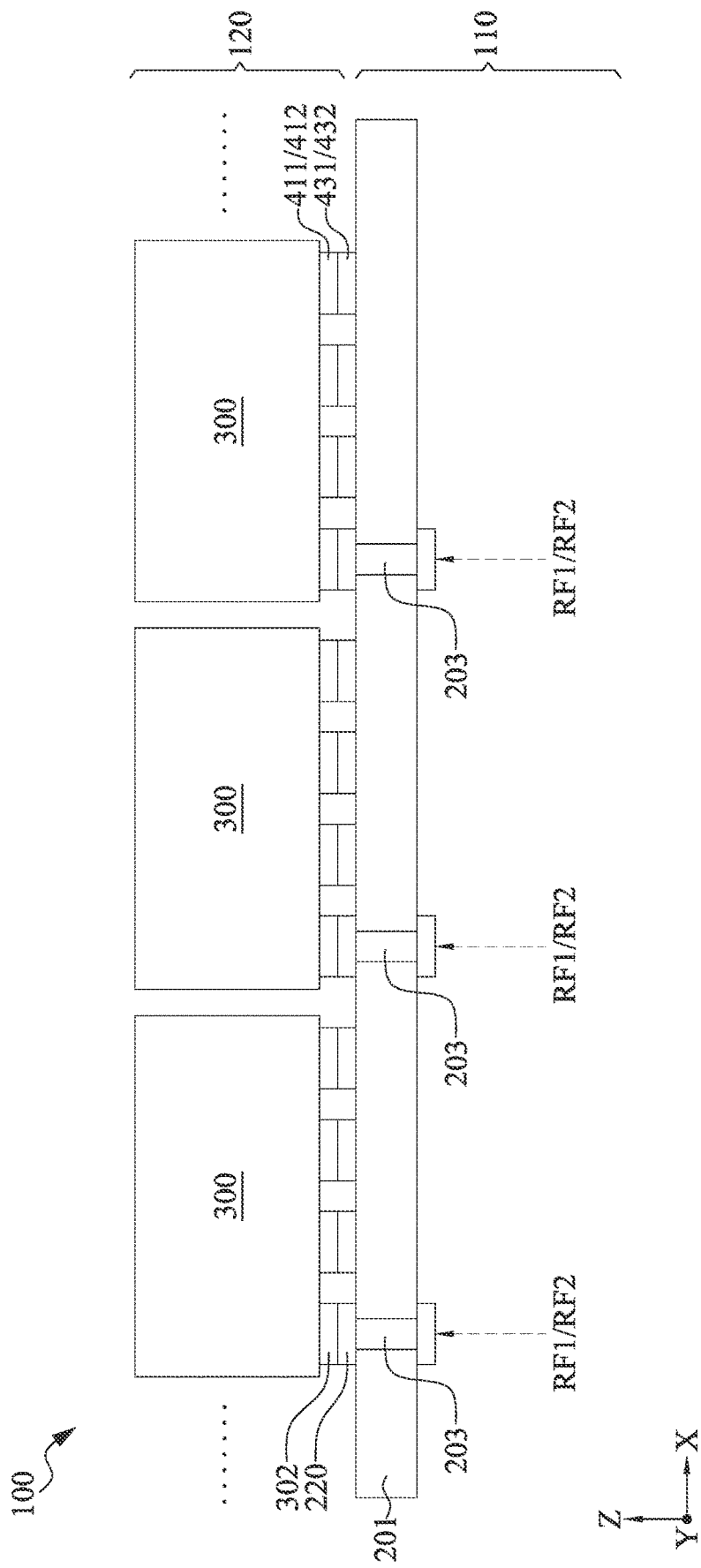
FIG. 6 is a cross-sectional view of an antenna device, in accordance with some embodiments.

FIG. 6 is a cross-sectional view of the antenna device 100, in accordance with some embodiments. Referring to FIG. 6, the circuit substrate 110 includes the bonding layer 220 and a topmost insulating layer 201 underlying the bonding layer 220. The circuit substrate 110 further includes a plurality of conductive vias 203 extending through the topmost insulating layer 201 and electrically connecting the underlying conductive pads to the conductive pads 431, 432 of the bonding layer 220. Further, the antenna substrate 120 or the antenna cells 300 include the bonding layer 302, in which the bonding layer has the conductive pads 401, 402 (or conductive pads 411, 412).

The circuit substrate 110 is bonded to the antenna substrate 120 through the bonding of the conductive pads 431, 432 with the conductive pads 411, 412 to form an LGA bonding. Therefore, the RF signals RF1A, RF2A can be transmitted from the semiconductor chip 112 (see FIG. 1) to the antenna cells 300. Although not separately shown, the connectors 421 can be arranged between the conductive pads 431, 432 and the conductive pads 411, 412 to form a BGA bonding.

Figure 7:
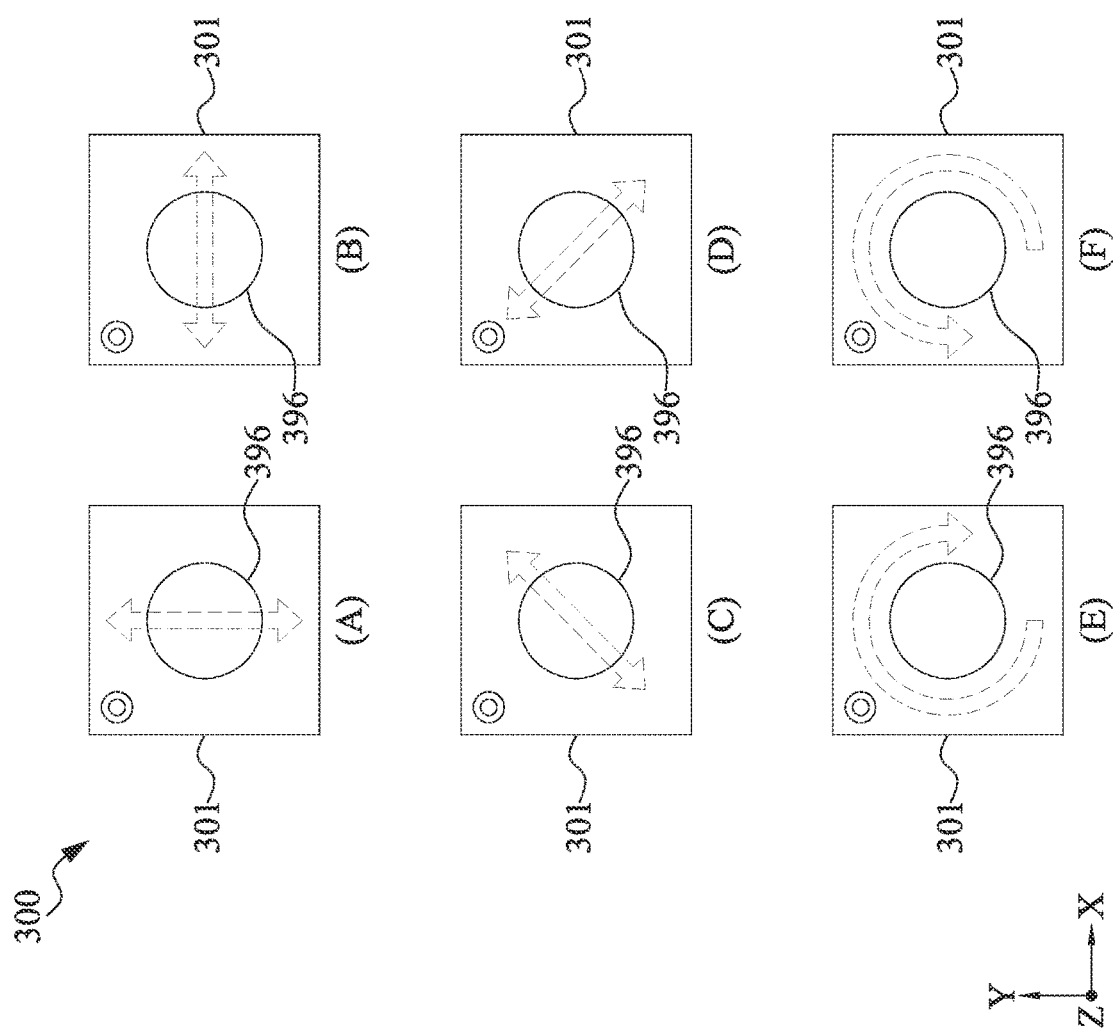
FIG. 7 shows schematic diagrams of an antenna cell with different antenna polarizations, in accordance with various embodiments.

FIG. 7 shows schematic diagrams of the antenna cell 300 with different antenna polarizations, in accordance with various embodiments. Referring to subfigures (A), (B), (C), (D), (E) and (F), the antenna cell 300 shows an schematic box representing the conduction path CP1 or CP2 of the conductive layer 308 or the antenna patch 396 of the conductive layer 314. Further, the antenna cell 300 further includes and an insulating layer 301 laterally surrounding the conduction path CP1, CP2, antenna patch 396. Each antenna patch 396 in different subfigures (A) through (F) may exhibit different polarization types of the antenna depending on the configurations of the component RF signals.

According to some embodiments, the straight arrows illustrated in the subfigures (A) and (B) indicate the direction of polarization for the antenna cell 300, either a vertical polarization in the direction of Y-axis as shown in subfigure (A), or a horizontal polarization in the direction of X-axis as shown in subfigure (B). Similarly, according to some embodiments, the straight arrows illustrated in the subfigures (C) and (D) indicate the directions of the angled linear polarization of the antenna cell 300, either in the direction of 45 degrees with respect to the plus X-axis as shown in subfigure (C), or in the direction of 135 degrees with respect to the plus X-axis as shown in subfigure (D).

According to some embodiments, the curved arrows illustrated in the subfigures (E) and (F) indicate the directions of a circular polarization of the antenna cell 300, either in a clockwise direction (right-hand circular polarization) as shown in subfigure (E), or in a counterclockwise direction (left-hand circular polarization) as shown in subfigure (F). Referring to FIG. 2A and FIG. 6, each antenna cell 300 in the antenna array 330 may exhibit identical polarization types for pursuing maximal the antenna transmission/receiving performance.

Figure 8A:
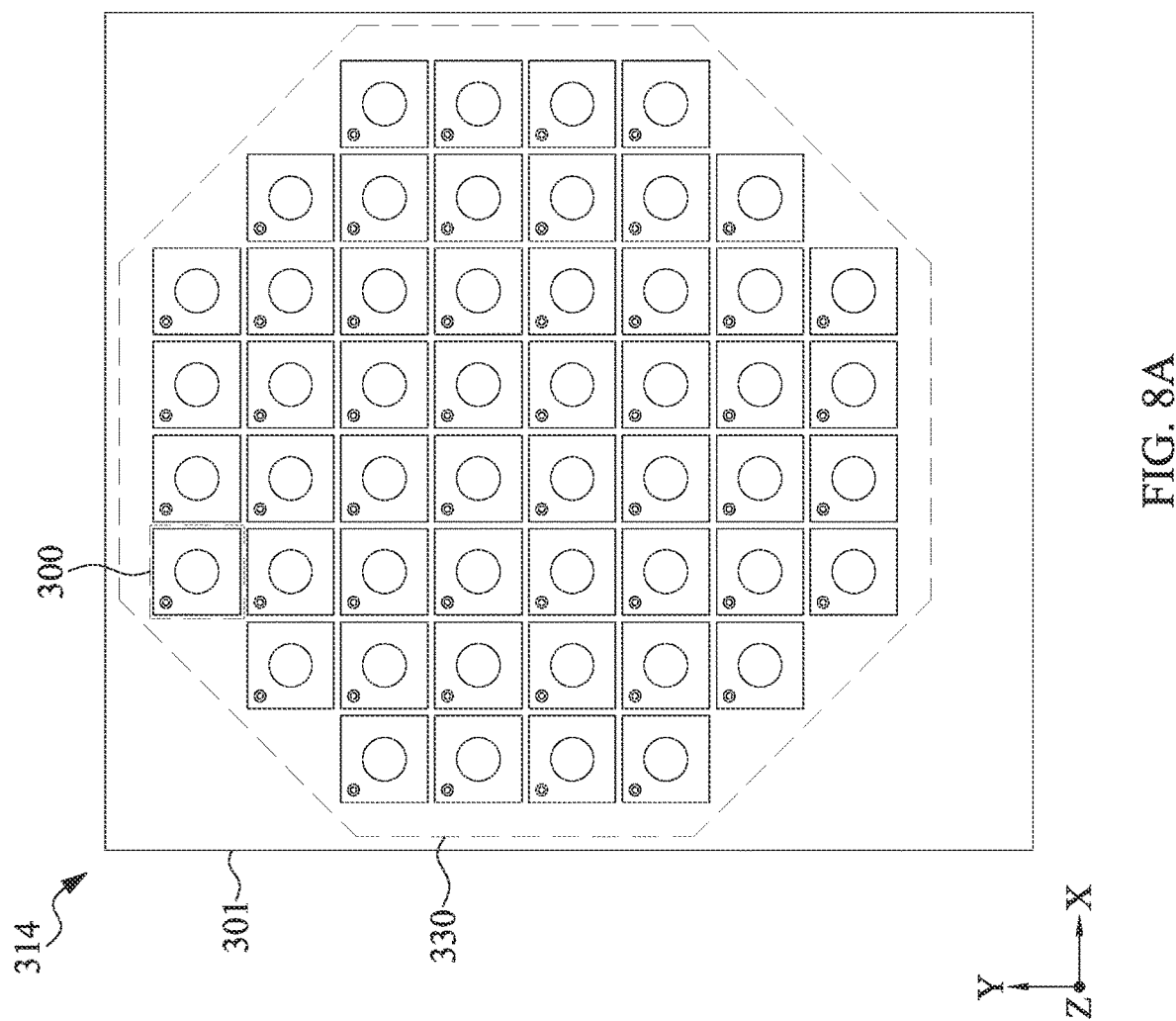
FIGS. 8A and 8B shows top views of an antenna array with different array configurations, in accordance with various embodiments.
Figure 8B:
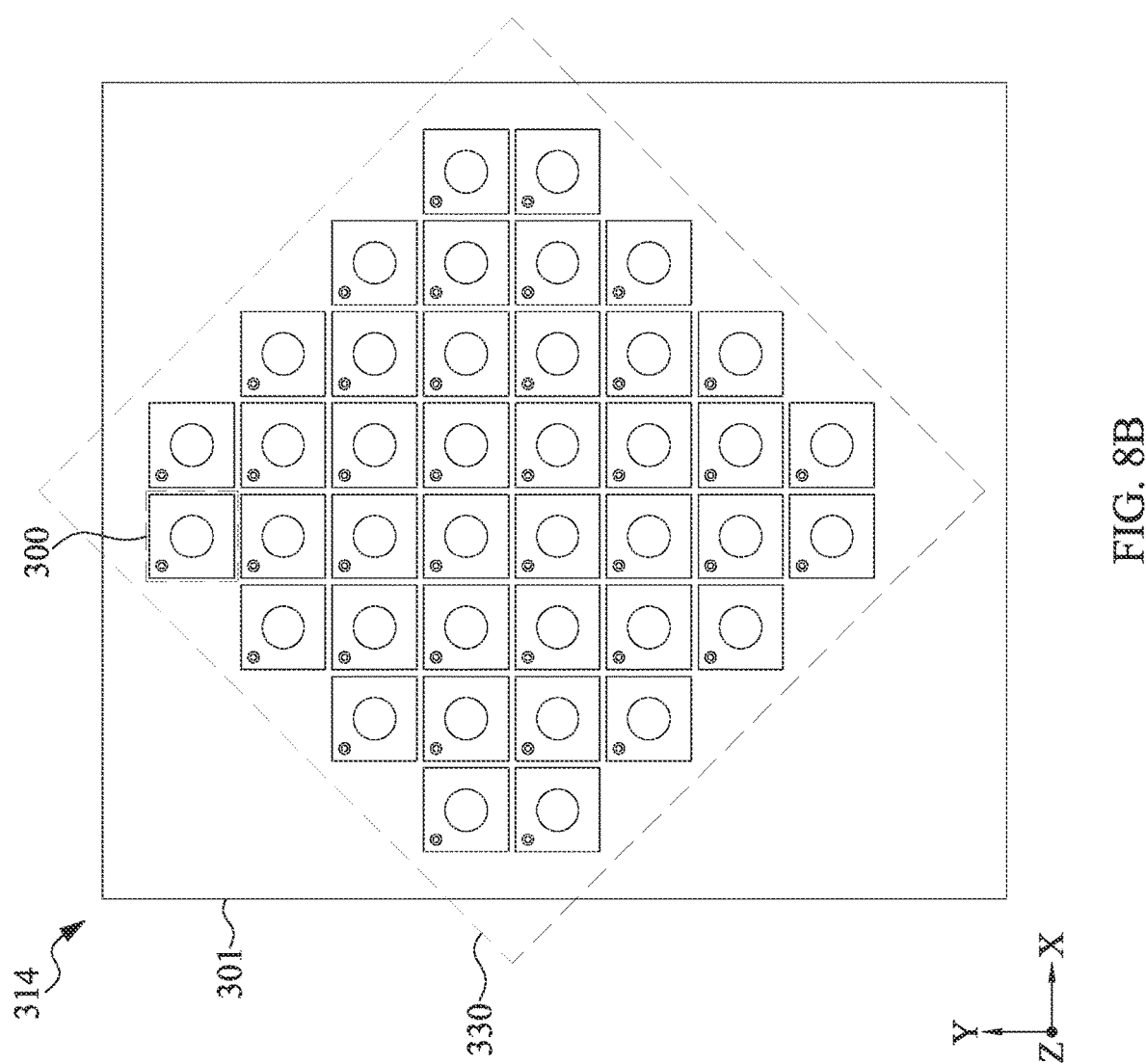

FIGS. 8A and 8B shows top views of the antenna array 330 with different array configurations, in accordance with various embodiments. Referring to FIG. 8A, the antenna array 330 is formed of 52 antenna cells 300 and includes a shape similar to an octagon. According to some embodiments, the antenna array 330 shown in FIG. 8A is symmetric about a center of the antenna array 330 or the conductive layer 314. According to some embodiments, the antenna array 330 shown in FIG. 8A is symmetric about a hypothetical central line passing through the center of the octagon and parallel to the X-axis or the Y-axis.

Referring to FIG. 8B, the antenna array 330 is formed of 40 antenna cells 300 and includes a shape similar to a diamond or a rhombus. According to some embodiments, the antenna array 330 shown in FIG. 8B is symmetric about a center of the antenna array 330 or the conductive layer 314. According to some embodiments, the antenna array 330 shown in FIG. 8B is symmetric about a hypothetical central line passing the center of the diamond shape and parallel to the X-axis or the Y-axis. The antenna arrays 330 shown in FIGS. 2A, 8A and 8B are for illustrative purposes only. Other shapes of the antenna array 330, e.g., a circular shape, a triangular shape, a hexagonal shape or other shapes, are also within the contemplated scope of the present disclosure.

Figure 9:
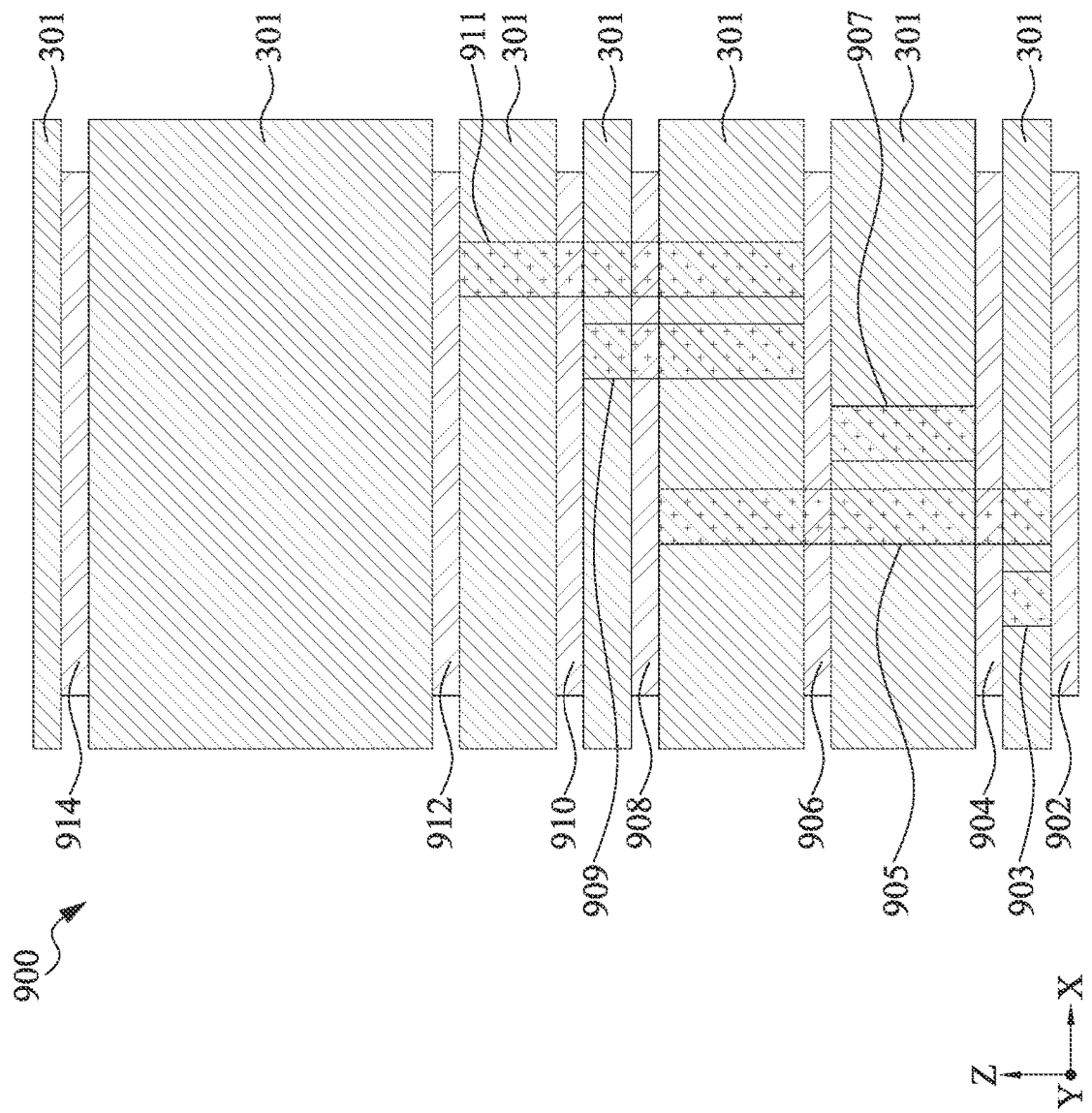
FIG. 9 is a cross-sectional view of an antenna cell of an antenna substrate, in accordance with some embodiments.

FIG. 9 is a cross-sectional view of an exemplary antenna cell 900 of the antenna substrate 120, in accordance with some embodiments. The antenna cell 900 is similar to the antenna cell 300 in many aspects, and these similar features will not be repeated for brevity. In addition, each of the antenna cell 300 shown in FIGS. 1 and 2A can be replaced with an antenna cell 900 shown in FIG. 9. For example, the antenna substrate 120 is formed of an antenna array 330 formed of a plurality of antenna cells 900. The antenna cells 900 may be electrically coupled to the circuit substrate 110 and individually controllable by the semiconductor chip 112 to transmit or receive one or more RF signals with respective phases and amplitudes.

According to some embodiments, the antenna cell 900 (or equivalently the antenna substrate 120) includes a plurality of insulating layers 301 and a plurality of conductive layers 902, 904, 906, 908, 910, 912 and 914 alternately arranged with the plurality of insulating layers 301. According to some embodiments, each of the insulating layers 301 includes an electrically insulating material or a dielectric material similar to the insulating layers 301 described with reference to FIG. 2B, e.g., ceramics, glass, or the like. According to some embodiments, each of the conductive layers 902 through 914 are formed of a conductive material, e.g., copper, aluminum, tungsten, silver and gold. The conductive layers 902 through 914 may be in a form of foil laminated with the insulating layers 301 to construct each antenna cell 900 or the antenna substrate 120.

According to some embodiments, the antenna cell 900 includes conductive vias 903, 905, 907, 909 and 911 extending in the vertical direction of the antenna cell 900 and running through one or more insulating layers 301. The conductive vias 903 through 911 may be formed of a conductive material, such as copper, tungsten, aluminum, silver, gold, or other suitable conductive materials. The conductive vias 903 through 911 are configured to electrically connect different conductive layers 902 through 912 to convey the RF signals or provide grounding. For example, the conductive via 903 electrically connects the conductive layer 902 to the conductive layer 904, while the conductive via 905 electrically connects the conductive layer 902 to the conductive layer 908. Similarly, the conductive via 907 may electrically connect the conductive layer 904 to the conductive layer 906, the conductive via 909 may electrically connect the conductive layer 906 to the conductive layer 910, and the conductive via 911 may electrically connect the conductive layer 906 to the conductive layer 912. The configurations and connection arrangements of the conductive vias 903 through 911 described with reference to FIG. 9 are shown for illustrative purposes only. Other configurations or connection arrangements of the conductive vias 903 through 911 are also within the contemplated scope of the present disclosure.

FIGS. 10A, 10B, 10C, 10D, 10E, 10F, and 10G are perspective views of different conductive layers 902 through 914, respectively, of the antenna cell 900 shown in FIG. 9, in accordance with some embodiments.

Figure 10A:
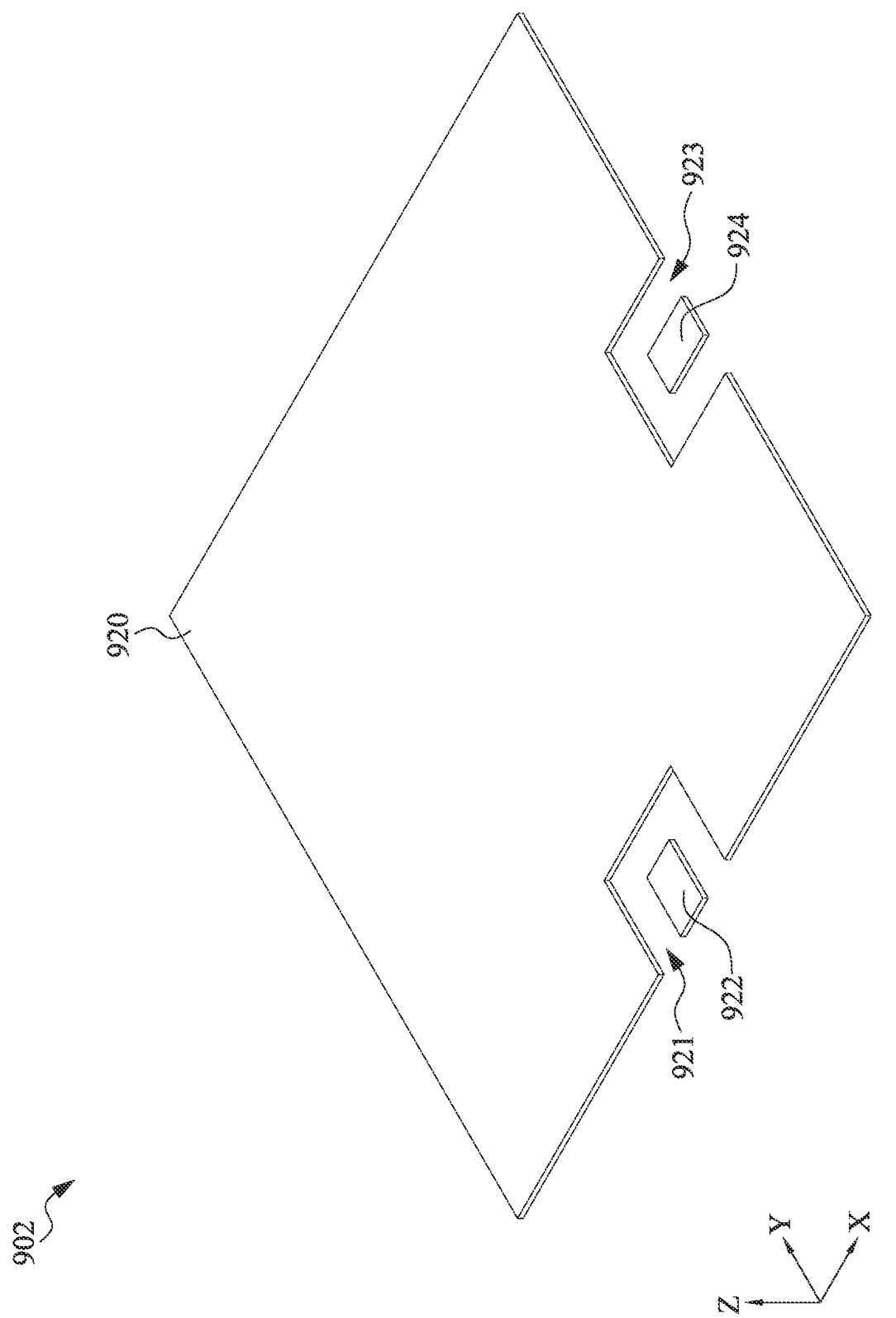
FIGS. 10A, 10B, 10C, 10D, 10E, 10F, and 10G are perspective views of different conductive layers of the antenna cell shown in FIG. 9, in accordance with some embodiments.

Referring to FIG. 10A, the conductive layer 902 is configured as a bonding layer electrically bonded to the conductive layer 220 of the circuit substrate 110, in a manner similar to the bonding layer 302. According to some embodiments, the conductive layer 902 serves as a signal input layer and includes two signal input ports configured to receive the RF signals RF1A, RF2A from the contact pads of the circuit substrate 110 and transmit the RF signals RF1A, RF2A to the overlying conductive layers 904 through 914. The conductive layer 902 further includes a ground patch 920 laterally surrounding the signal input ports. According to some embodiments, the two signal input ports respectively include a first contact pad 922 and a second contact pad 924 arranged on the lower side of the conductive layer 902. The first contact pad 922 and the second contact pad 924 are separated from the ground patch 920 by isolation regions 921 and 923, respectively. The isolation regions 921 and 923 may be filled with an insulating material of the insulating layer 301. According to some embodiments, the contact pads 922, 924 have a rectangular shape.

Figure 11:
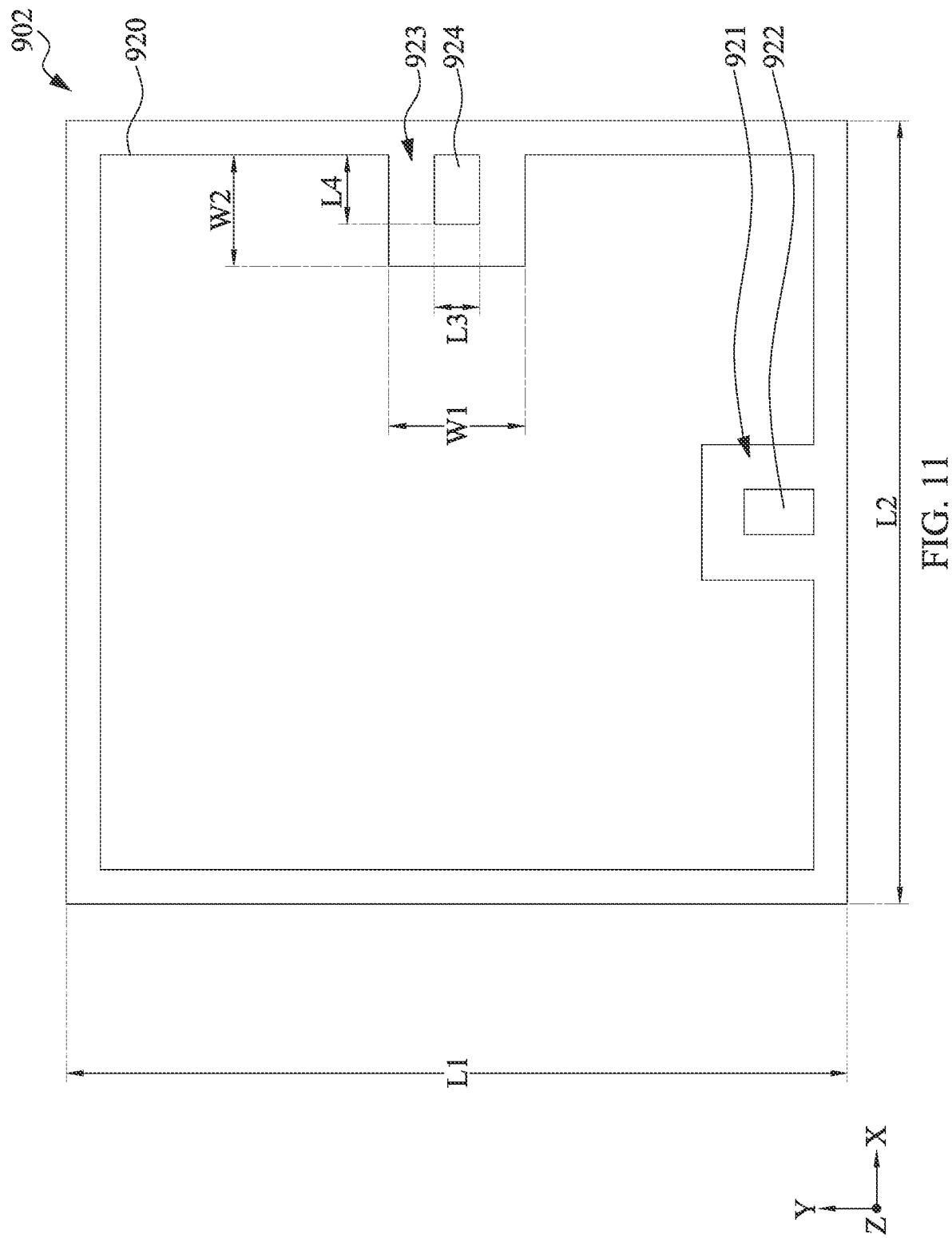
FIG. 11 is a bottom view of a bonding layer of the antenna cell shown in FIG. 9, in accordance with various embodiments.

FIG. 11 is a bottom view of the conductive layer 902 of the antenna cell 900 shown in FIG. 9, in accordance with various embodiments.

Referring to FIG. 11, the bonding layer 902 is similar to the bonding layer shown in FIG. 5A, and the similar features will not be repeated for brevity. Referring to FIG. 11, the bonding layer 902 includes a ground patch 920 and conductive pads (contact pads) 922 and 924 arranged on the lower side of the bonding layer 902. The ground patch 920 may include two recesses 921 and 923 for accommodating the conductive pads 922 and 924, respectively. The ground patch 920 is configured to provide a reference grounding level to the antenna cell 900, while the conductive pads 922, 924 are configured to be electrically connected to the bonding layer 220. The conductive pads 922 and 924 may correspond to the first contact pad P1 and the second contact pad P2 shown in FIG. 4A and configured to receive the pair of the RF signals RF1A, RF2A from the circuit substrate 110. The conductive pads 922, 924 may have a rectangular shape, or a circular shape. The bonding layer 902 may further include the insulating layer 301 to laterally surround the ground patch 920 and the conductive pads 922, 924 and electrically isolate each of the conductive pads 922, 924 from each other and from the ground patch 920. According to some embodiments, the contact pads 922, 924 have a circular shape.

According to some embodiments, a length L1 or a width L2 of a single antenna cell 900 of the conductive layer 902 may be determined to be greater than or less than λ/2, wherein the symbol λ denotes the wavelength of the RF signals RF1A, RF2A. According to some embodiments, a length L3 or a width L4 of the conductive pad 922 or 924 may be determined to be in a range between about 0.1 mm and about 0.5 mm. According to some embodiments, a length W1 or a width W2 of the recess 921 or 923 may be determined to be in a range between about 0.3 mm and 1.0 mm.

Figure 10B:
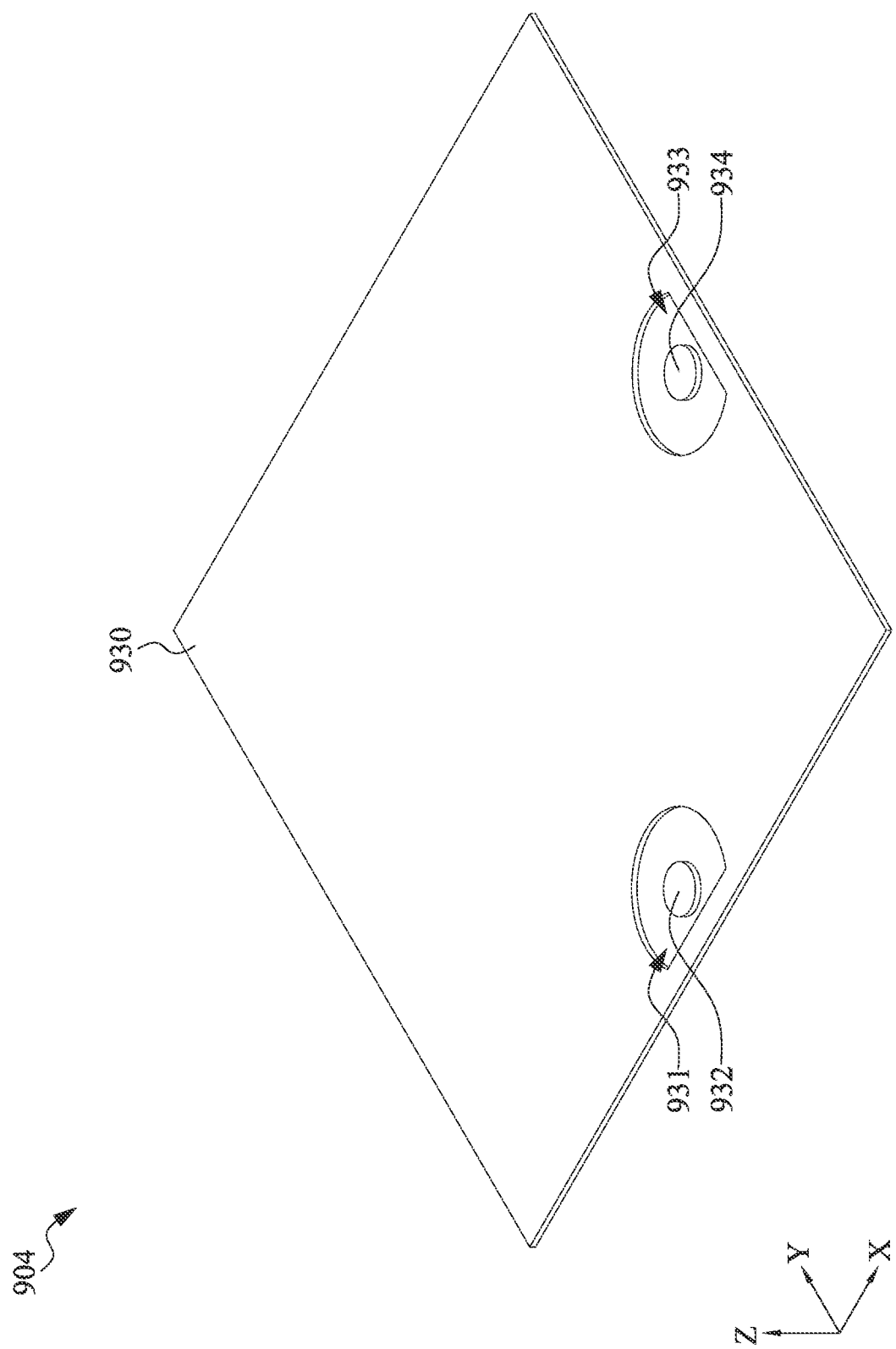

Referring to FIG. 10B, the conductive layer 904 is configured as a ground layer and used to provide a reference (grounding) level to the antenna cell 900, e.g., providing a reference ground to the bonding layer 902. The conductive layer 904 includes two signal input ports having respective contact pads 932 and 934 configured to receive the RF signals RF1A, RF2A from the contact pads 922 and 924 of the conductive layer 902, and transmit the RF signals RF1A, RF2A to the overlying conductive layers 906 through 914. The conductive layer 904 further includes a ground patch 930 laterally surrounding the contact pads 932, 934, and isolation regions 931, 933 electrically isolating the contact pads 932, 934 from the ground patch 930. The configurations and materials of the contact pads 932, 934 are similar to those of the contact pads 922, 924, and these similar aspects will not be repeated for brevity. Further, the conductive pads 932, 934 are aligned with contact pads 922, 924, respectively, from a top-view perspective. According to some embodiments, the contact pads 932, 934 have a circular shape. The conductive pads 932, 934 may be electrically connected to contact pads 922, 924 through some instances of the conductive via 903 or 905, while the ground patch 930 may be electrically connected to the ground patch 920 through some other instances of the conductive via 903.

Figure 10C:
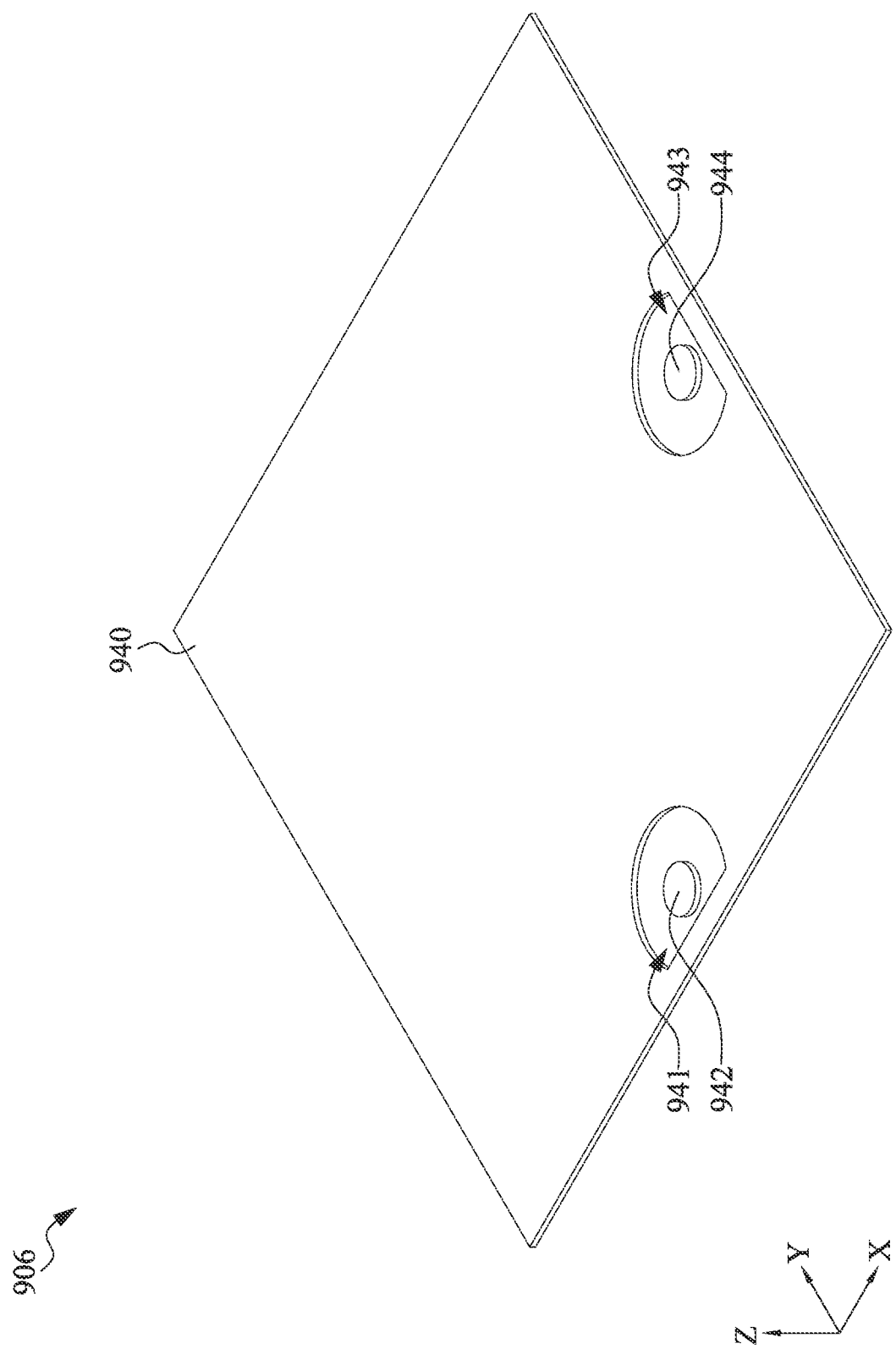

Referring to FIG. 10C, the conductive layer 906 is configured as a ground layer and used to provide a reference (grounding) level to the antenna cell 900, e.g., providing a reference ground to the bonding layer 902 and overlying layers 908 through 914. The conductive layer 906 includes two signal input ports having respective contact pads 942 and 944 configured to receive the RF signals RF1A, RF2A from the contact pads 932 and 934 of the conductive layer 904, and transmit the RF signals RF1A, RF2A to the overlying conductive layers 908 through 914. The conductive layer 906 further includes a ground patch 940 laterally surrounding the contact pads 942, 944, and isolation regions 941, 943 electrically isolating the contact pads 942, 944 from the ground patch 940. The configurations and materials of the contact pads 942, 944 are similar to those of the contact pads 922, 924, and these similar aspects will not be repeated for brevity. Further, the conductive pads 942, 944 are aligned with contact pads 932, 934 and the contact pads 922, 924, respectively, from a top-view perspective. According to some embodiments, the contact pads 942, 944 have a circular shape. The conductive pads 942, 944 may be electrically connected to contact pads 932, 934 through some instances of the conductive via 905 or 907, while the ground patch 940 may be electrically connected to the ground patch 930 through some other instances of the conductive via 905 or 907.

Figure 10D:
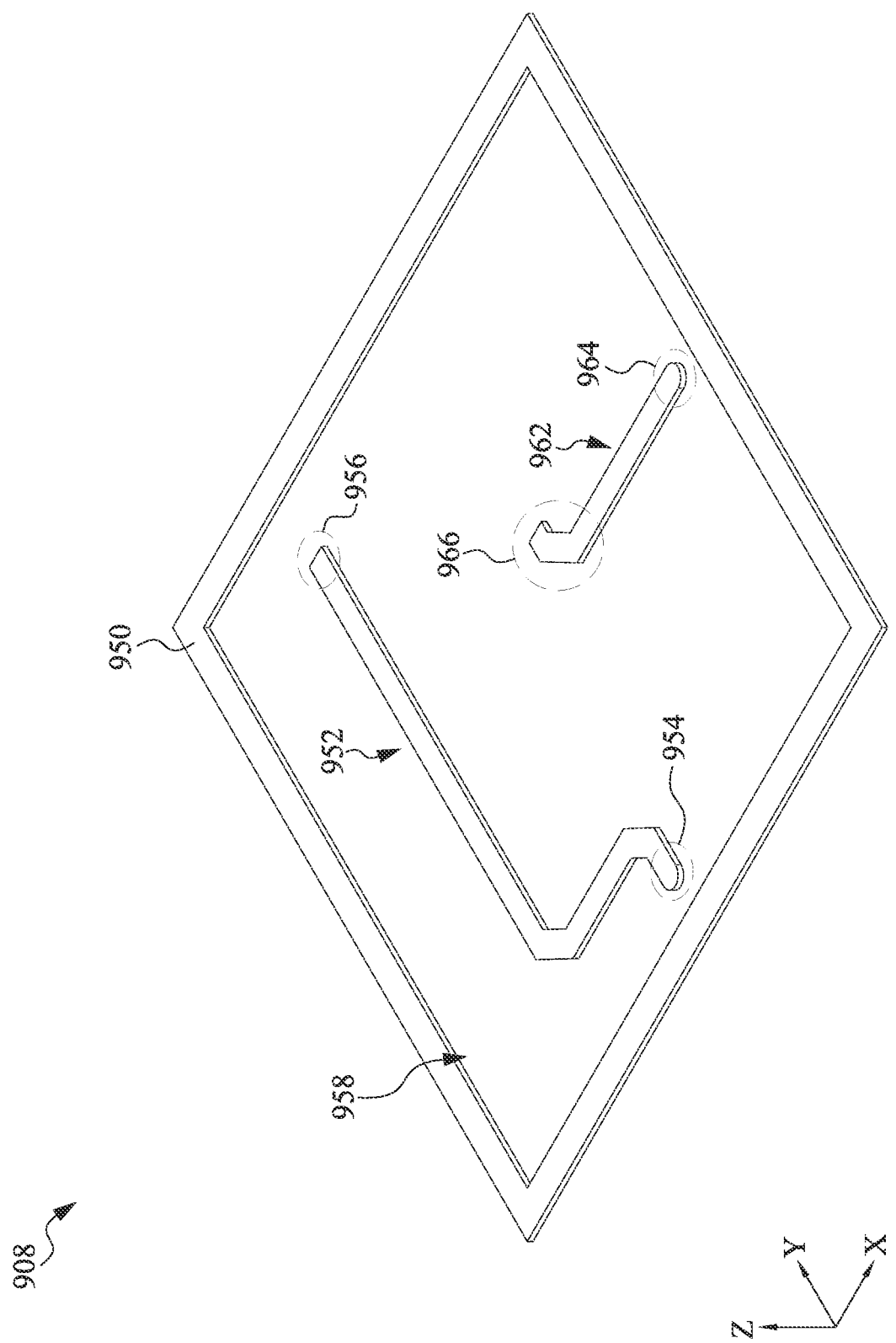

Referring to FIG. 10D, the conductive layer 908 is configured as a feeding network layer and used to transmit a pair of first feeding signals, i.e., the RF signals RF1A and RF2A, respectively. The conductive layer 908 includes a first signal input port 952 and a second signal input port 962. The first signal input port 952 and the second signal input port 962 are configured to receive the RF signals RF1A, RF2A from the conductive layer 906 and transmit the same to the overlying conductive layers 910 through 914. The first signal input port 952 may include a conductive line with an elongated shape, e.g., a bar shape or a strip shape, from a top-view perspective and extending from a first end 954 to a second end 956. Similarly, the second signal input port 962 may include a conductive line an elongated shape, e.g., a bar shape or a strip shape, from a top-view perspective and extending from a first end 964 to a second end 966. The configurations of the first input port 952 and the second signal input port 962 may be similar to the contact pad 332 of the second signal input port 162 in the conductive layer the 304 to achieve desirable electrical properties of the RF signals RF1A, RF2A. According to some embodiments, the longitudinal axis of the conductive line of the first signal input port 952 is substantially perpendicular to the longitudinal axis of the conductive line of the second signal input port 962, e.g., the conductive lines of the first and second signal input ports 952 and 962 are along the Y-axis and X-axis, respectively.

The conductive layer 908 further includes a ground patch 950 laterally surrounding the first signal input port 952 and the second signal input port 962. The ground patch 950 may be in ring shape. According to some embodiments, the first signal input port 952 and the second signal input port 962 are electrically insulated from the ground patch 950 through an isolation region 958 formed of an insulation material of the insulating layer 301. The first ends 954 and 964 may be electrically connected to contact pads 942, 944 through some instances of the conductive via 905, 909 or 911, while the ground patch 950 may be electrically connected to the ground patch 940 through some other instances of the conductive via 909 or 911.

Figure 10E:
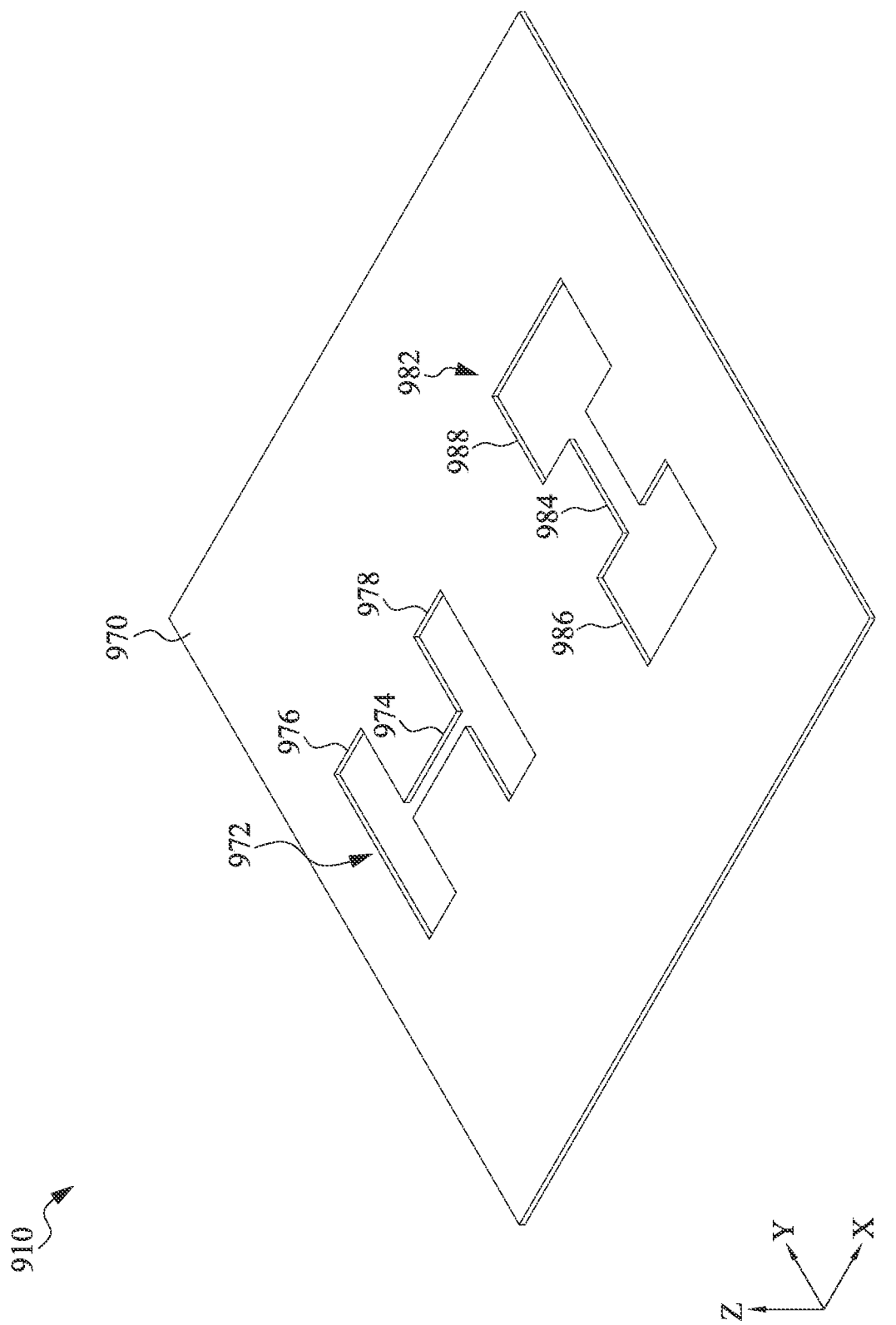

Referring to FIG. 10E, the conductive layer 910 is configured as an aperture feeding network layer as well as a ground layer, and used to generate two pair of second feeding signals, i.e., RF1B and RF2B based on the first feeding signals RF1A and RF2A of the conductive layer 908. According to some embodiments, the conductive layer 910 includes a first aperture 972 and a second aperture 982 configured to receive the pair of first feeding signals RF1A and RF2A from the conductive layer 908, convert the RF signals RF1A, RF2A into two pairs of second feeding signals RF1B, RF2B, and transmit the same to the conductive layer 912.

Figure 12:
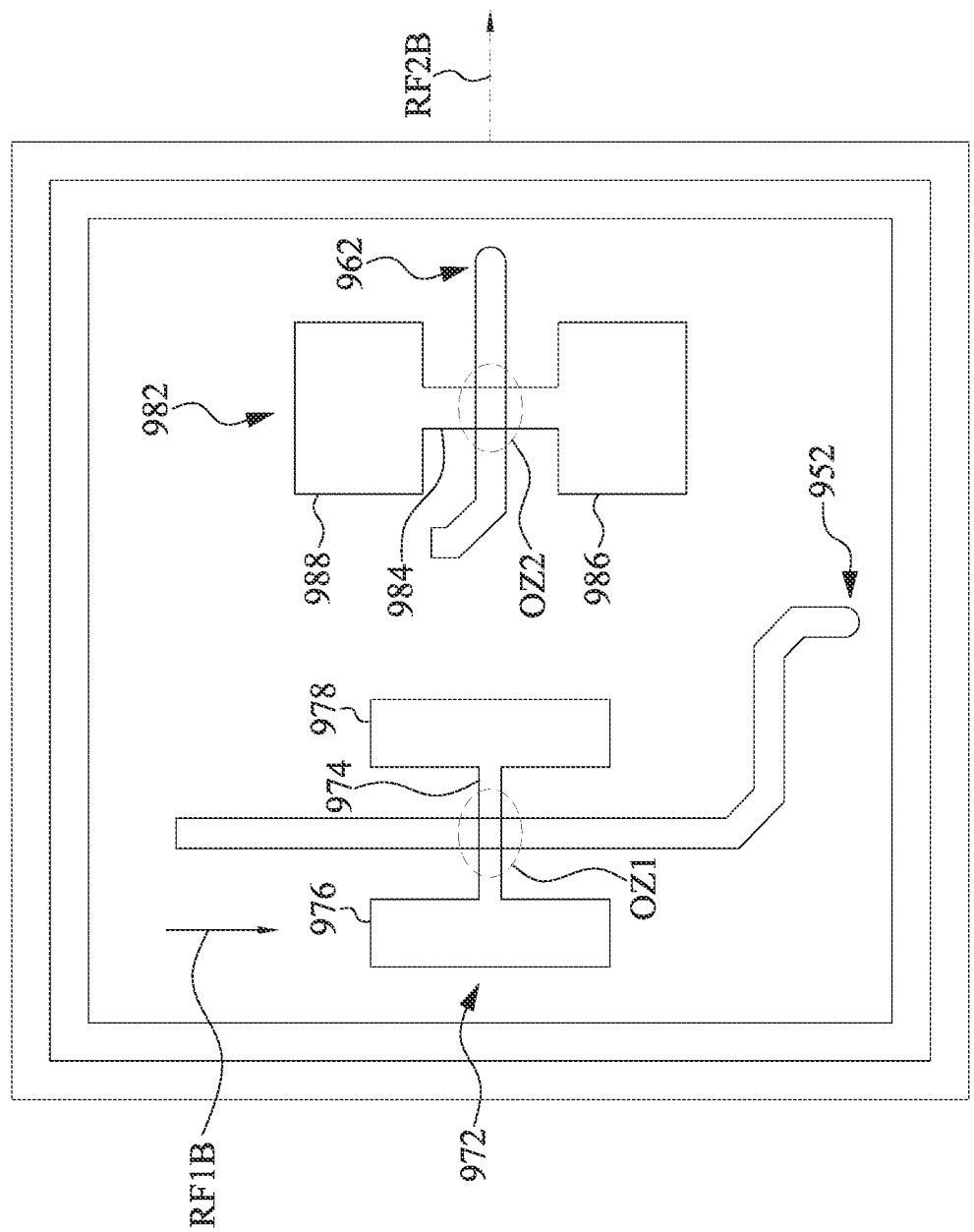
FIG. 12 is a plan view of an feeding network layer shown in FIG. 10D overlapped with an aperture feeding layer shown in FIG. 10E, both of the antenna cell shown in FIG. 9, in accordance with various embodiments.

FIG. 12 is a plan view of the feeding network layer 908 shown in FIG. 10D overlapped with the aperture feeding layer 910 shown in FIG. 10E, both of the antenna cell 900 shown in FIG. 9, in accordance with various embodiments. Referring to FIGS. 10D, 10E and 12, according to some embodiments, the first aperture 972 includes a signal input slit 974, a first signal output slit 976 and a second signal output slit 978, wherein the signal input slit 974 is an aperture formed in the aperture feeding layer 910 and configured to receive the first feeding signal RF1A from the first signal input port 952 of the feeding network layer 908. The first feeding signal RF1A is electromagnetically coupled to the signal input slit 974 at an overlapping zone OZ1 of the first signal input port 952 and the first aperture 972. According to some embodiments, the first signal output slit 976 and the second signal output slit 978 are apertures formed in the aperture feeding layer 910 shown in FIG. 10E and connected to the signal input slit 974. The first feeding signal RF1A propagates to the first signal output slit 976 and the second signal output slit 978 to form a pair of the second feeding signal RF1B. According to some embodiments, the overlapping zone OZ1 is situated in substantially the middle point of the signal input slit 974 such that the travelling distances of the first feeding signal RF1A from the overlapping zone OZ1 to both of the signal output slits 976 and 978 are substantially equal. As a result, the two instances of the second RF signals RF1B output at the first signal output slit 976 and the second signal output slit 978 have substantially equal phases. In other words, the pair of RF signals RF1B generated by the first signal output slit 976 and the second signal output slit 978 are substantially identical. According to some embodiments, the signal input slit 974 extends in a direction substantially perpendicular to that in which the first signal input port 952 extends, and also perpendicular to that in which the signal output slits 976, 978 extend. As a result, the second feeding signal RF1B has an electric field with a vertical polarization (indicated by an solid arrow in FIG. 12) in the direction of the longitudinal axis of the first signal input port 952, e.g., along the Y-axis.

Still referring to FIGS. 10D, 10E and 12, according to some embodiments, the second aperture 982 includes a signal input slit 984, a first signal output slit 986 and a second signal output slit 988, wherein the signal input slit 984 is an aperture formed in the aperture feeding layer 910 and configured to receive the first feeding signal RF2A from the second signal input port 962 of the feeding network layer 908. The first feeding signal RF2A is electromagnetically coupled to the signal input slit 984 at an overlapping zone OZ2 of the second signal input port 962 and the second aperture 982. According to some embodiments, the first signal output slit 986 and the second signal output slit 988 are apertures formed in the aperture feeding layer 910 shown in FIG. 10E and connected to the signal input slit 984. The first feeding signal RF2A propagates to the first signal output slit 986 and the second signal output slit 988 to form two instances of the second feeding signal RF2B. According to some embodiments, the overlapping zone OZ2 is situated in substantially the middle point of the signal input slit 984 such that the travelling distances of the first feeding signal RF1B from the overlapping zone OZ2 to both of the signal output slits 986 and 988 are substantially equal. As a result, the two instances of the second RF signal RF2B output from the first signal output slit 986 and the second signal output slit 988 have substantially equal phases. In other words, the two RF signals RF2B generated by the first signal output slit 986 and the second signal output slit 988 are substantially identical. According to some embodiments, the signal input slit 984 extends in a direction substantially perpendicular to that in which the second signal input port 962 extends, and also perpendicular to that in which the signal output slits 986, 988 extend. As a result, the second feeding signal RF2B has an electric field with a horizontal polarization (indicated by a dashed arrow in FIG. 12) in the direction of the longitudinal axis of the second signal input port 962, e.g., along the X-axis.

Referring back to FIG. 10E, the conductive layer 910 may further include a ground patch 970 defining the first aperture 972 and the second aperture 982, in which the first aperture 972 and the second aperture 982 are separated from each other by the ground patch 970. The ground patch 970 may be electrically connected to the ground patch 950 through some instances of the conductive via 909 or 911.

Figure 10F:
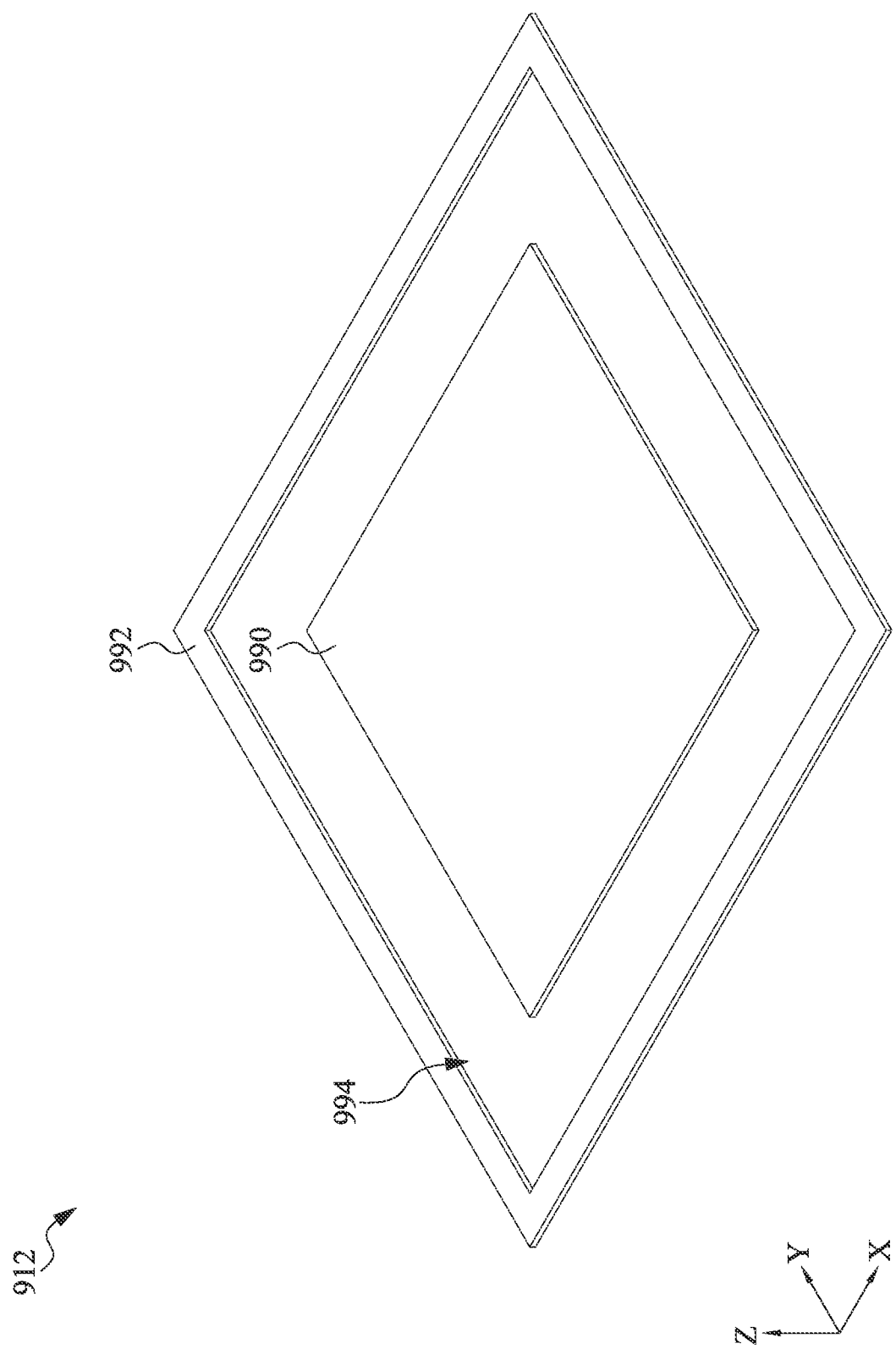

Referring to FIG. 10F, the conductive layer 912 is configured as a driving antenna layer and used to generate or radiate an (RF) antenna signal according to the two pairs of second feeding signals RF1B and RF2B provided from the signal output slits 976, 978, 986 and 988 of the conductive layer 910. According to some embodiments, the conductive layer 912 includes an antenna patch 990 arranged at a center of the conductive layer 912. The conductive layer 912 may further include a ground patch 992 having a ring shape arranged on a periphery of the conductive layer 912 and laterally surrounding the antenna patch 990. The antenna patch 990 is electrically isolated from the ground patch 992 by an isolation region 994. The antenna patch 990 may include a rectangular shape, where the four sides of the rectangle are parallel with the four boundary sides of the antenna cell 900 or the conductive layer 912.

According to some embodiments, the antenna substrate 120 shown in FIGS. 9 and 10A through 10G is provided as an exemplary transmitter. However, the antenna substrate 120 can also be configured as a receiver, wherein the antenna RF signal is received from the ambient environment and transmitted to the circuit substrate 110 via a signal path. The signal path starts from the conductive layer 914, through the conductive layers 912, 910, 908, 906 and 904, and reaches the conductive layer 902. The order of RF signal transmission and processing for the receiver may be reversed to that for the transmitter.

According to some embodiments, the antenna patch 990 is configured to generate and radiate an antenna signal to the conductive layer 314, wherein the antenna signal includes two pairs of second feeding signals RF1B and RF2B, and the first pair of second feeding signals RF1B are independent of the second pair of second feeding signals RF2B. The ground patch 992 may be electrically connected to the ground patch 970 through some instances of the conductive via 911.

Figure 10G:
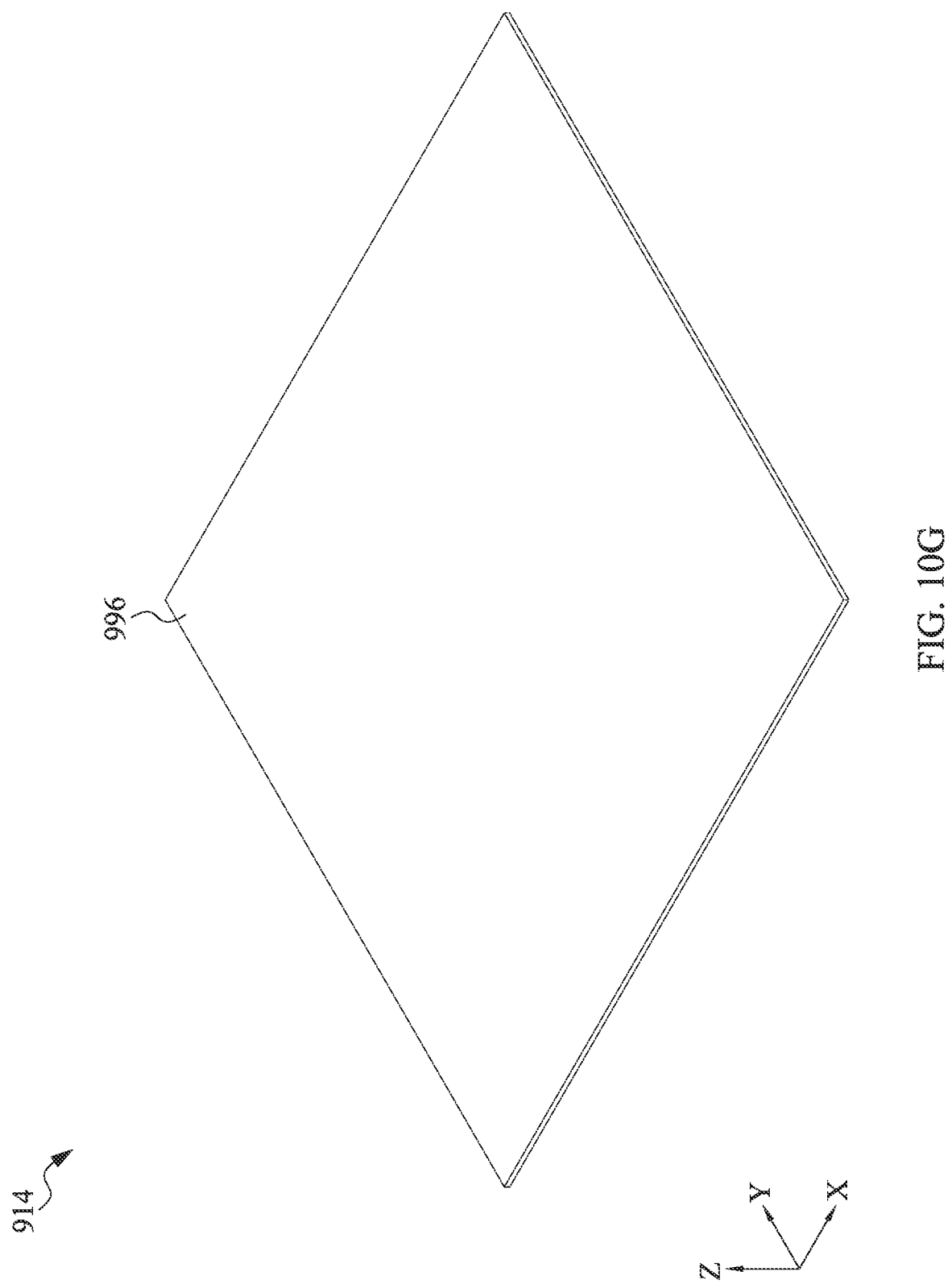

Referring to FIG. 10G, the conductive layer 914 is configured as a radiating antenna layer and electromagnetically coupled to the driving antenna layer 912. The conductive layer 914 may be electromagnetically receive the RF signal generated by the antenna patch 990 of the driving antenna layer 912 and radiate the RF signal. According to some embodiments, the antenna patch 996 is arranged to occupy the entirety of the conductive layer 914. According to some embodiments, the conductive layer 914 is free from any ground patch or conductive via.

The proposed dual-substrate antenna device 100 provides advantages. The number of layers of the circuit substrate 110, e.g., a PCB substrate, is reduced as compared to existing PCB-based antenna designs, and thus a better trade-off between high performance and low cost of the antenna device is achieved. As a result, the number of layers of the circuit substrate 110 can be reduced by a great amount, which would significantly lower the manufacturing cost of the circuit substrate 110 or the antenna device 100. Furthermore, the antenna cell 300 is a modular design, which simplifies the maintenance and repairing complexity since the repairing task can be accomplished by merely replacing the defective antenna cell 300 with a new antenna cell 300 without affecting the other portions of the antenna device 100. In addition, the tasks for testing the antenna cells 300 and the semiconductor chip 112 can be done separately. Such design can also reduce the workload of the design team and maintenance team.

Additionally, the antenna array 330 is scalable without redesigning or re-routing the existing circuits of the circuit substrate 110. Therefore, the time to market can be shortened effectively. Moreover, since the circuit substrate 110 and the antenna substrate 120 are formed using different materials for their respective insulating layers 201A, 201B and 301, the flexibility of determining the most suitable insulating layers 201A, 201B and 301 for the circuit substrate 110 and the antenna substrate 102 is increased.

The proposed design also benefits the antenna performance. The antenna dimension accuracy can be improved without significantly increasing cost, and better antenna performance can be achieved with much better inter-port isolation and reduced cross-polarization interference. More antenna configurations can be determined without significantly changing the original circuit framework. Further, the same circuit design of the circuit substrate 110 can come with different configurations of the antenna layer 314, such as linear or circular polarization for 5G or LEO applications, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An antenna device, comprising:
   a first substrate comprising:
      a semiconductor chip configured to transmit or receive a first radio-frequency (RF) signal;
      a first ground layer configured to provide ground to the semiconductor chip; and
      a signal layer arranged on a side of the first substrate opposite to the semiconductor chip and configured to transmit the first RF signal;
   a second substrate comprising an antenna array formed of antenna cells, each of the antenna cells including:
      a first antenna layer configured to radiate second RF signals based on the first RF signal; and
      a second ground layer configured to provide ground to the first antenna layer; and
   a plurality of connectors electrically coupling the semiconductor chip to the antenna array.

2. The antenna device of claim 1, wherein the first substrate further comprises a plurality of first insulating layers formed of a first dielectric material, and the second substrate further comprises a plurality of second insulating layers formed of a second dielectric material different from the first dielectric material.

3. The antenna device of claim 2, wherein the second dielectric material includes ceramics or glass.

4. The antenna device of claim 1, wherein the antenna cells are arranged on a side of the second substrate opposite to the first substrate and separated from each other by a third dielectric material.

5. The antenna device of claim 1, wherein the connectors are arranged as a ball grid array (BGA) between the first substrate and the second substrate.

6. The antenna device of claim 1, wherein the first substrate further includes a first bonding layer having an array of conductive pads configured as a land grid array (LGA) and bonded to a bonding layer of the second substrate.

7. The antenna device of claim 1, wherein the second substrate further comprises:
   a first feeding network layer configured to transmit the first RF signal; and
   a second feeding network layer comprising two signal input ports and four signal output ports configured to convert the first RF signal into two pairs of the second RF signals, wherein two signals in each pair of the second RF signals have a phase difference of substantially 180 degrees.

8. The antenna device of claim 7, wherein the second substrate further comprises a second antenna layer electrically coupled to the second feeding network layer and configured to transmit the second RF signals to the first antenna layer.

9. The antenna device of claim 8, wherein the first antenna layer and the second antenna layer comprise a cross shape.

10. The antenna device of claim 7, wherein the first feeding network layer comprises a first signal input port and a second signal input port, wherein the first signal input port comprises a first contact pad having a circular shape, and the second signal input port comprises a second contact pad having an elongated shape.

11. An antenna device, comprising:
a first substrate comprising:
   a semiconductor chip arranged on a first side of the first substrate and configured to receive or transmit a first radio-frequency (RF) signal;
   a plurality of first insulating layers; and
   a plurality of first conductive layers alternately arranged with the first insulating layers, the first conductive layers including a signal layer arranged on a second side of the first substrate opposite to the first side and configured to receive the first RF signal; and
a second substrate electrically coupled to the first substrate and comprising an array of antenna cells, wherein each of the antenna cells includes:
   a plurality of second insulating layers; and
   a plurality of second conductive layers alternately arranged with the second insulating layers, the second conductive layers comprising a first antenna layer configured to radiate second RF signals based on the first RF signal.

12. The antenna device of claim 11, further comprising a plurality of connectors electrically coupling each of the antenna cells to the first substrate.

13. The antenna device of claim 12, wherein the plurality of second conductive layers further comprise a first feeding network layer comprising two signal input ports electrically coupled to the first substrate through the plurality of connectors and configured to generate the second RF signals based on the first RF signal.

14. The antenna device of claim 13, wherein the plurality of second conductive layers further comprise a second feeding network layer arranged between the first feeding network layer and the first antenna layer, the second feeding network layer comprising two signal input ports and four signal output ports, wherein the four signal output ports are configured to generate a first pair and a second pair of the second RF signals for transmission in a horizontal polarization and a vertical polarization, respectively.

15. The antenna device of claim 14, wherein the plurality of second conductive layers further comprising a first ground layer and a second ground layer on two sides of the second feeding network layer.

16. The antenna device of claim 15, wherein the plurality of second conductive layers further comprising a second antenna layer electromagnetically coupled to the first antenna layer, the second antenna layer comprising:
   a first antenna patch electrically coupled to the four signal output ports of the second feeding network layers; and
   a third ground layer laterally surrounding the first antenna patch.

17. The antenna device of claim 16, wherein the first antenna layer comprises a second antenna patch aligned with the first antenna patch from a top-view perspective.

18. The antenna device of claim 13, wherein first phases of the first pair of the second RF signals are offset from second phases of the second pair of the second RF signals by 90 degrees to cause the second RF signals to be transmitted with a left-hand circular polarization or a right-hand circular polarization.

19. The antenna device of claim 13, wherein the plurality of second conductive layers further comprise an aperture feeding layer arranged between the first feeding network layer and the first antenna layer, the aperture feeding layer comprising two apertures separated from each other are configured to electromagnetically couple the first RF signal and generate the second RF signals.

20. The antenna device of claim 11, wherein each of the antenna cells is detachable from the second substrate while keeping other antenna cells intact on the antenna device.

* * * * *